/ US008977992B2

(12) United States Patent
Cernea

(10) Patent No.: US 8,977,992 B2
(45) Date of Patent: *Mar. 10, 2015

(54) HIGHLY COMPACT NON-VOLATILE MEMORY AND METHOD THEREOF

(75) Inventor: Raul-Adrian Cernea, Santa Clara, CA (US)

(73) Assignee: Innovative Memory Systems, Inc., Costa Mesa, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 13/548,065

(22) Filed: Jul. 12, 2012

(65) Prior Publication Data

US 2012/0281472 A1  Nov. 8, 2012

Related U.S. Application Data

(60) Continuation of application No. 12/274,959, filed on Nov. 20, 2008, now Pat. No. 8,225,242, which is a continuation of application No. 11/144,540, filed on Jun. 3, 2005, now abandoned, which is a division of application No. 10/254,483, filed on Sep. 24, 2002, now Pat. No. 6,983,428.

(51) Int. Cl.
*G06F 17/50* (2006.01)
*G11C 7/10* (2006.01)
(Continued)

(52) U.S. Cl.
CPC .............. *G11C 7/1006* (2013.01); *G11C 7/06* (2013.01); *G11C 7/18* (2013.01); *G11C 16/10* (2013.01); *G11C 16/26* (2013.01); *G11C 2216/14* (2013.01)
USPC .......................................... 716/100; 716/101

(58) Field of Classification Search
USPC ................ 716/100–105; 365/230.03, 189.14, 365/185.11, 220, 189.05, 185.18
See application file for complete search history.

(56) References Cited

U.S. PATENT DOCUMENTS

| 4,357,685 A | 11/1982 | Daniele et al. |
|---|---|---|
| 4,802,136 A | 1/1989 | Nose et al. |

(Continued)

FOREIGN PATENT DOCUMENTS

| EP | 0 851 424 A2 | 7/1998 |
|---|---|---|
| JP | 3-156966 A | 7/1991 |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner* — Binh Tat
(74) *Attorney, Agent, or Firm* — Imperium Patent Works LLP; Mark D. Marrello

(57) ABSTRACT

A non-volatile memory device capable of reading and writing a large number of memory cells with multiple read/write circuits in parallel has an architecture that reduces redundancy in the multiple read/write circuits to a minimum. The multiple read/write circuits are organized into a bank of similar stacks of components. In one aspect, each stack of components has individual components factorizing out their common subcomponents that do not require parallel usage and sharing them as a common component serially. Other aspects, include serial bus communication between the different components, compact I/O enabled data latches associated with the multiple read/write circuits, and an architecture that allows reading and programming of a contiguous row of memory cells or a segment thereof. The various aspects combined to achieve high performance, high accuracy and high compactness.

8 Claims, 22 Drawing Sheets

(51) Int. Cl.
*G11C 7/06* (2006.01)
*G11C 7/18* (2006.01)
*G11C 16/10* (2006.01)
*G11C 16/26* (2006.01)

(56) References Cited

U.S. PATENT DOCUMENTS

| | | | |
|---|---|---|---|
| 4,852,062 | A | 7/1989 | Baker et al. |
| 5,070,032 | A | 12/1991 | Yuan et al. |
| 5,095,344 | A | 3/1992 | Harari |
| 5,172,338 | A | 12/1992 | Mehrotra et al. |
| 5,307,232 | A | 4/1994 | Manske |
| 5,307,323 | A | 4/1994 | Fukuda et al. |
| 5,313,421 | A | 5/1994 | Guterman et al. |
| 5,315,541 | A | 5/1994 | Harari et al. |
| 5,343,063 | A | 8/1994 | Yuan et al. |
| 5,359,571 | A | 10/1994 | Yu |
| 5,418,752 | A | 5/1995 | Harari et al. |
| 5,570,315 | A | 10/1996 | Tanaka et al. |
| 5,595,924 | A | 1/1997 | Yuan et al. |
| 5,661,053 | A | 8/1997 | Yuan |
| 5,768,192 | A | 6/1998 | Eitan |
| 5,774,397 | A | 6/1998 | Endoh et al. |
| 5,815,444 | A | 9/1998 | Ohta |
| 5,835,406 | A | 11/1998 | Chevallier et al. |
| 5,903,495 | A | 5/1999 | Takeuchi et al. |
| 5,940,329 | A | 8/1999 | Seitsinger et al. |
| 5,946,253 | A | 8/1999 | Fujiwara |
| 6,011,725 | A | 1/2000 | Eitan |
| 6,034,891 | A | 3/2000 | Norman |
| 6,034,910 | A | 3/2000 | Iwase |
| 6,046,935 | A | 4/2000 | Takeuchi et al. |
| 6,122,193 | A * | 9/2000 | Shibata et al. ............ 365/185.03 |
| 6,222,762 | B1 | 4/2001 | Guterman et al. |
| 6,256,252 | B1 | 7/2001 | Arimoto |
| 6,327,206 | B2 | 12/2001 | Kubota et al. |
| 6,373,746 | B1 | 4/2002 | Takeuchi et al. |
| 6,385,075 | B1 | 5/2002 | Taussig et al. |
| 6,396,736 | B1 | 5/2002 | Jyouno et al. |
| 6,469,945 | B2 | 10/2002 | Patti et al. |
| 6,496,971 | B1 | 12/2002 | Lesea et al. |
| 6,603,683 | B2 | 8/2003 | Hsu et al. |
| 6,609,236 | B2 | 8/2003 | Watanabe et al. |
| 6,717,858 | B2 | 4/2004 | Kawai et al. |
| 6,781,877 | B2 | 8/2004 | Cernea et al. |
| 6,891,753 | B2 | 5/2005 | Cernea |
| 6,975,536 | B2 | 12/2005 | Maayan et al. |
| 6,983,428 | B2 | 1/2006 | Cernea |
| 7,085,159 | B2 | 8/2006 | Cernea |
| 2001/0024397 | A1 | 9/2001 | Kubota et al. |
| 2001/0052062 | A1 | 12/2001 | Lipovski |
| 2002/0075714 | A1 * | 6/2002 | Pereira et al. ................ 365/49 |
| 2002/0118574 | A1 * | 8/2002 | Gongwer et al. ........ 365/185.28 |
| 2004/0057283 | A1 | 3/2004 | Cernea |
| 2005/0219910 | A1 | 10/2005 | Cernea |

FOREIGN PATENT DOCUMENTS

| | | |
|---|---|---|
| JP | H05-101646 A | 4/1993 |
| JP | H09-297996 A | 11/1997 |
| JP | H10-027473 A | 1/1998 |
| JP | 10-055688 A | 2/1998 |
| JP | 10172292 A | 6/1998 |
| JP | H11-073790 A | 3/1999 |
| KR | 1998-064679 | 10/1998 |

OTHER PUBLICATIONS

"Notification of the Transmittal of the International Search Report or the Declaration," in PCT Application No. PCT/PCTUS03/29182, European Patent Office, Feb. 23, 2004, 7 pages.

"Notification of the Transmittal of the International Search Report or the Declaration," in PCT Application No. PCT/PCTUS03/30134, European Patent Office, Feb. 17, 2004, 7 pages.

"Notification of the Transmittal of the International Search Report or the Declaration," in PCT Application No. PCT/PCTUS03/29141, European Patent Office, Feb. 13, 2004, 7 pages.

U. Tietze—CH. Schenk: "Halbleiterschaltungstechnik," 1974, Springer-Verlag, Berlin; XP002267743; paragraph 18.6.2 (translation).

European Office Action mailed in related European Application No. 03 749 728.6 on Jul. 28, 2005, 3 pages.

European Office Action mailed in European Application No. 03 754 870.8 on Aug. 9, 2005, 3 pages.

USPTO Office Action mailed in U.S. Appl. No. 11/122,738 on Oct. 18, 2005, 9 pages.

European Patent Office, "Communication Pursuant to Article 96(2) EPC", mailed in European Patent Application No. 03 754 648.8-2210 on Jun. 21, 2005, 2 pages.

China State Intellectual Property Office, "First Office Action," corresponding Chinese Application No. 038246783, mailed on May 23, 2008, 15 pages (including translation.).

Taiwanese Intellectual Property Office, "Office Action and Search Report," corresponding Taiwanese Patent Application No. 92126114, mailed on Dec. 10, 2008, 13 pages. (including translation.).

Japanese Patent Office, "Notification of Reasons for Refusal," corresponding Japanese Patent Application No. 2004-539870, mailed on Jun. 16, 2009, 5 pages (including translation.).

Korean Patent Office, "Notice of Preliminary Rejection," corresponding Korean Patent Application No. 2005-7005088, mailed on Mar. 26, 2010, 4 pages (including translation.).

Japanese Patent Office, "Notification of Reasons for Refusal," corresponding Japanese Patent Application No. 2004-539870, mailed on Jun. 29, 2010, 6 pages (including translation.).

China State Intellectual Property Office, "Second Office Action," corresponding Chinese Patent Application No. 03824678.3, mailed on Aug. 26, 2010, 18 pages (including translation.).

Korean Patent Office, "Notice of Preliminary Rejection," corresponding Korean Patent Application No. 2005-7005088, mailed on Jan. 24, 6 pages. (including translation.).

China State Intellectual Property Office, "Third Office Action," corresponding Chinese Patent Application No. 03824678.3, mailed on Jul. 5, 2011, 7 pages (including translation.).

* cited by examiner

| CLK | $M_1$ | $S_1$ | $M_2$ | $S_2$ | .... | $M_k$ | $S_k$ |
|---|---|---|---|---|---|---|---|
| 1 | $D_1$ | | | | .... | | |
| 1* | $D_1^*$ | $D_1$ | | | .... | | |
| 2 | $D_2$ | $D_1^*$ | $D_1$ | | .... | | |
| 2* | $D_2^*$ | $D_2$ | $D_1^*$ | $D_1$ | .... | | |
| . | . | . | . | . | .... | . | . |
| k | $D_{k-1}^*$ | $D_{k-1}$ | $D_{k-2}^*$ | $D_{k-2}$ | .... | $D_1$ | |
| k* | $D_k^*$ | $D_k$ | $D_{k-1}^*$ | $D_{k-1}$ | .... | $D_1^*$ | $D_1$ |

… # HIGHLY COMPACT NON-VOLATILE MEMORY AND METHOD THEREOF

CROSS REFERENCE TO RELATED APPLICATIONS

This application is a continuation of application Ser. No. 12/274,959, filed Nov. 20, 2008, now U.S. Pat. No. 8,225,242, which is a continuation of application Ser. No. 11/144,540, filed on Jun. 3, 2005, now abandoned, which in turn is a divisional of application Ser. No. 10/254,483, filed on Sep. 24, 2002 now U.S. Pat. No. 6,983,428, which applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones having highly compact and high performance write and read circuits

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

Examples of Non-Volatile Memory Cells

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their Vises in memory systems and methods of manufacturing them are given in U.S. Pat. Nos. 5,070,032, 5,095,344, 5,315, 541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1—left and T1—right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1—left is being accessed, both the T2 and T1—right are turned on to allow the current in the T1—left's portion of the channel to pass between the source and the drain. Similarly, when the storage unit T1—right is being accessed, T2 and T1—left are turned on. Erase is effected by having a portion of the select gate polysilicon in close proximity to the floating gate and applying a substantial positive voltage (e.g. 20V) to the select gate so that the electrons stored within the floating gate can tunnel to the select gate polysilicon.

FIG. 1D illustrates schematically a string of memory cells organized into an NAND cell. An NAND cell 50 consists of a series of memory transistors M1, M2, . . . Mn (n=4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within an NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935.

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 10) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to memory elements in the array.

FIG. 6A is a schematic block diagram of an individual read/write module 190. Essentially, during read or verify, a sense amplifier determines the current flowing through the drain of an addressed memory transistor connected via a selected bit line. The current depends on the charge stored in the memory transistor and its control gate voltage. For example, in a multi-state EEPROM cell, its floating gate can be charged to one of several different levels. For a 4-level cell, it may be used to store two bits of data. The level detected by the sense amplifier is converted by a level-to-bits conversion logic to a set of data bits to be stored in a data latch.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

Referring to FIG. 5, the read/write circuits 170 is organized into banks of read/write stacks 180. Each read/write stack 180 is a stack of read/write modules 190. In a memory array, the column spacing is determined by the size of the one or two transistors that occupy it. However, as can be seen from FIG. 6A, the circuitry of a read/write module will likely be implemented with many more transistors and circuit elements and therefore will occupy a space over many columns. In order to service more than one column among the occupied columns, multiple modules are stacked up on top of each other.

FIG. 6B shows the read/write stack of FIG. 5 implemented conventionally by a stack of read/write modules 190. For example, a read/write module may extend over sixteen columns, then a read/write stack 180 with a stack of eight read/write modules can be used to service eight columns in parallel. The read/write stack can be coupled via a column decoder to either the eight odd (1, 3, 5, 7, 9, 11, 13, 15) columns or the eight even (2, 4, 6, 8, 10, 12, 14, 16) columns among the bank.

As mentioned before, conventional memory devices improve read/write operations by operating in a massively parallel manner on all even or all odd bit lines at a time. This architecture of a row consisting of two interleaved pages will help to alleviate the problem of fitting the block of read/write circuits. It is also dictated by consideration of controlling bit-line to bit-line capacitive coupling. A block decoder is used to multiplex the set of read/write modules to either the even page or the odd page. In this way, whenever one set bit lines are being read or programmed, the interleaving set can be grounded to minimize immediate neighbor coupling.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

Therefore there is a general need for high performance and high capacity non-volatile memory. In particular, there is a need to have a compact non-volatile memory with improved read and program performance, and to have a memory system that minimize disturb effects.

SUMMARY OF INVENTION

These needs for a high performance yet compact non-volatile memory device are met by having a large block of read/write circuits to read and write a corresponding block of memory cells in parallel. In particular, the memory device has an architecture that reduces redundancy in the block of read/write circuits to a minimum. Significant saving in space as well as power is accomplished by redistributing the block of read/write modules into a block read/write module core portions that operate in parallel while interacting with a substantially smaller sets of common portions in a time-multiplexing manner. In one embodiment, the components of the core portions are organized into a bank of similar stacks, with each being a stack of such core components sharing a common portion.

According to another aspect of the invention, a serial bus provides communication between the read/write module core portions and the common portion in each stack. In this way, a minimum of communication lines need be used in each stack. A bus controller sends control and timing signals to control the operation of the components and their interactions through the serial bus. In a preferred embodiment, the corresponding components in all the similar stacks are controlled simultaneously.

According to another aspect of the invention, data latches associated with the multiple read/write circuits are I/O enabled by being linked in a compact manner to facilitate storage and serial transfer in the manner of a chain. In a preferred embodiment, the compact data latches are implemented by one or more chain of link modules. The individual link modules can be controlled to behave as either inverters or latches. A method enables the use of a minimum number of link modules by cycling data between a set of master link modules and a substantially smaller set of slave link modules.

Valuable chip space is saved by the use of the inventive data latches because they simplify the serial input and output of data with the data latches while allowing a substantial reduction in the number of slave link modules.

The saving in space by the various aspects of the present invention allows for a more compact chip design. The saving in circuits and therefore, in space and power consumption can amount to as much as fifty percent as compared to existing read/write circuits. In particular, the read/write modules can be densely packed so that they can simultaneously serve a contiguous row of memory cells of the memory array.

According to another aspect of the invention, a non-volatile memory device has an architecture where the read/write modules can be densely packed so that they can simultaneously serve a contiguous row of memory cells of the memory array. This allows contiguous reading and programming of a segment or an entire row of memory cells with resulting improvement in performance and reduction of coupling errors due to field from neighboring memory cells.

Additional features and advantages of the present invention will be understood from the following description of its preferred embodiments, which description should be taken in conjunction with the accompanying drawings.

DETAILED DESCRIPTION OF THE PREFERRED EMBODIMENTS

Figure 1A:
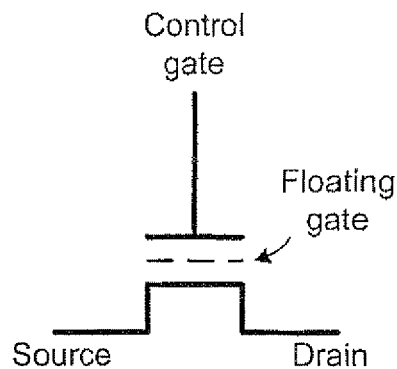
FIGS. 1A-1E illustrate schematically different examples of non-volatile memory cells.
Figure 1B:
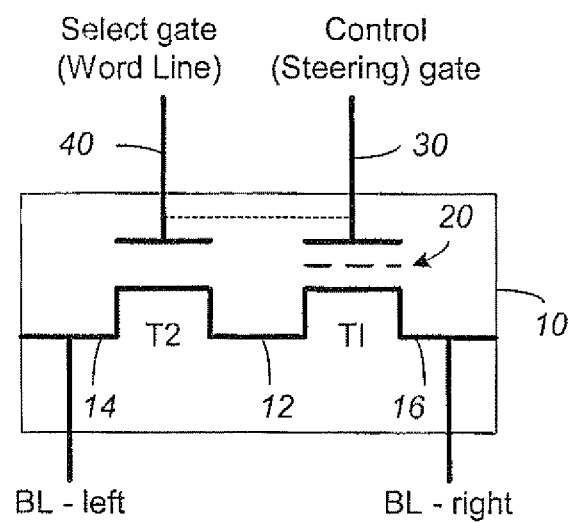
Figure 1C:
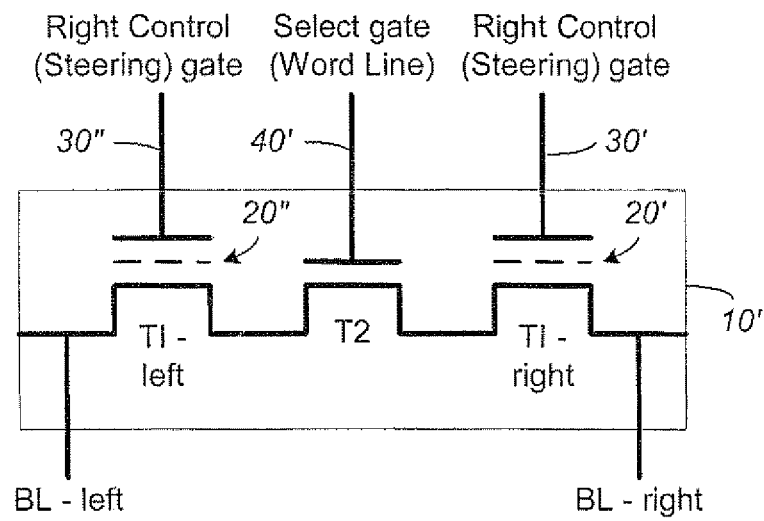
Figure 1E:
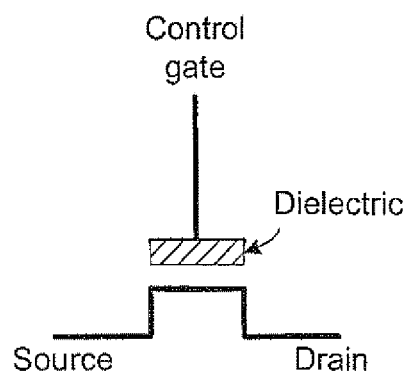
Figure 1D:
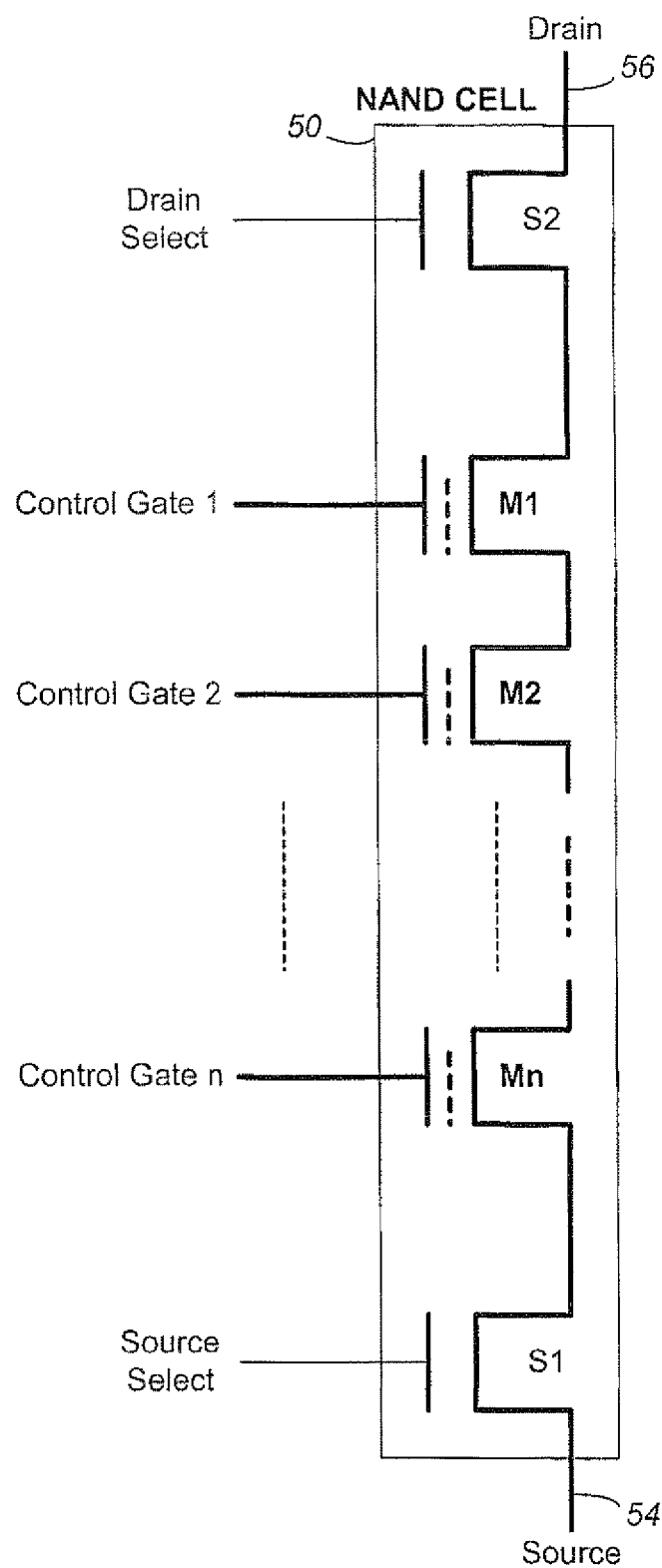
Figure 2:
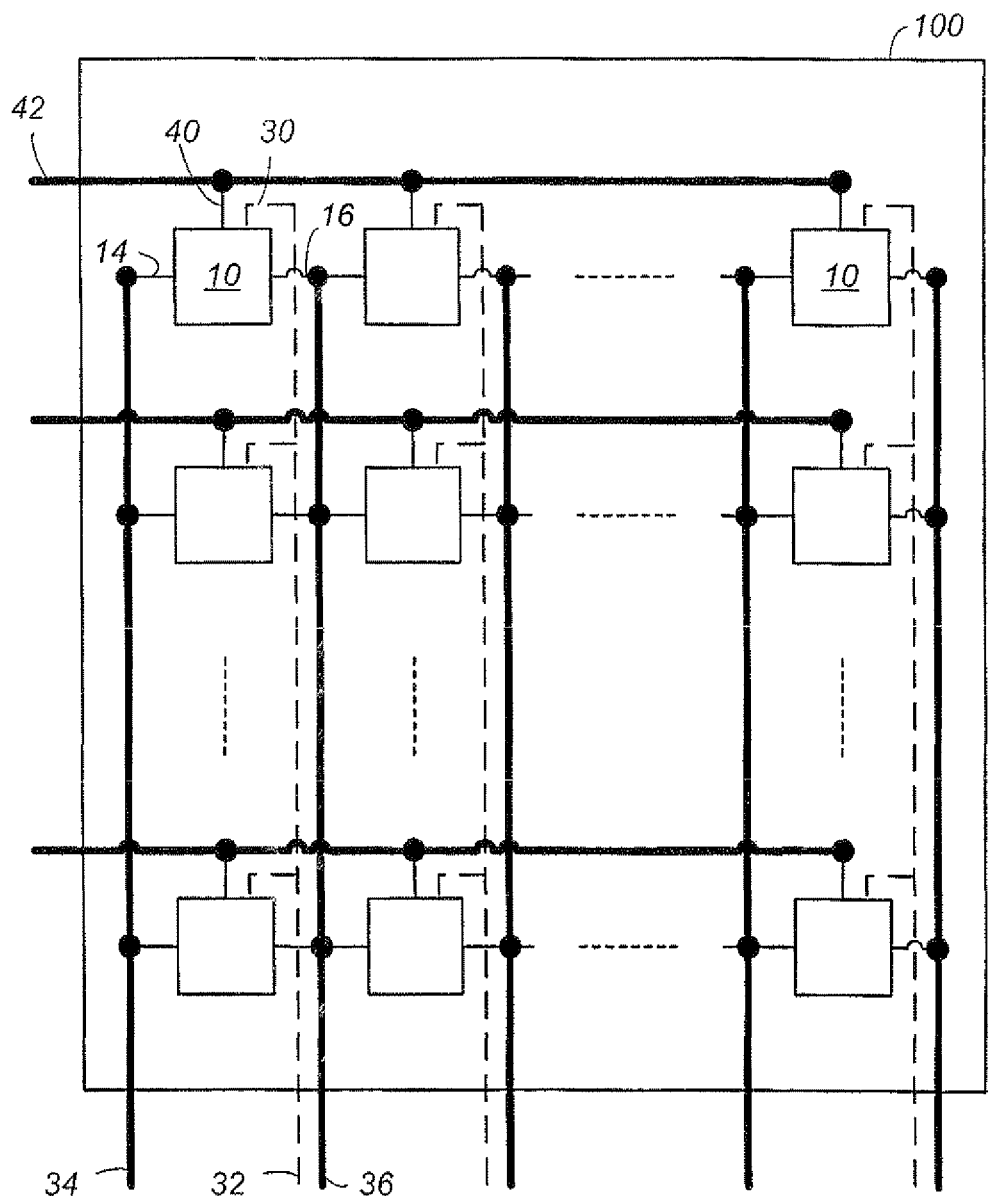
FIG. 2 illustrates an example of an NOR array of memory cells.
Figure 3:
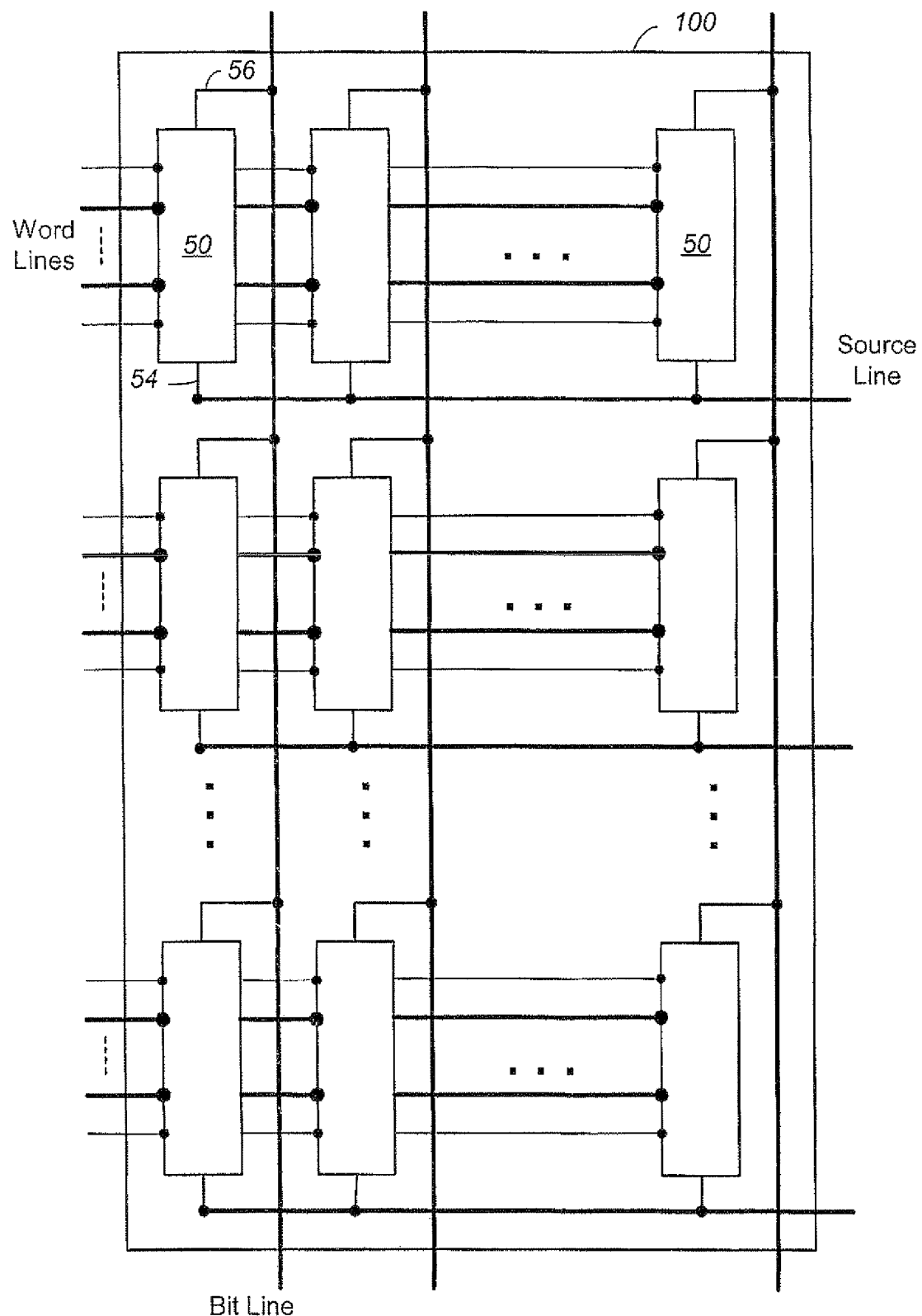
FIG. 3 illustrates an example of an NAND array of memory cells, such as that shown in FIG. 1D.
Figure 4:
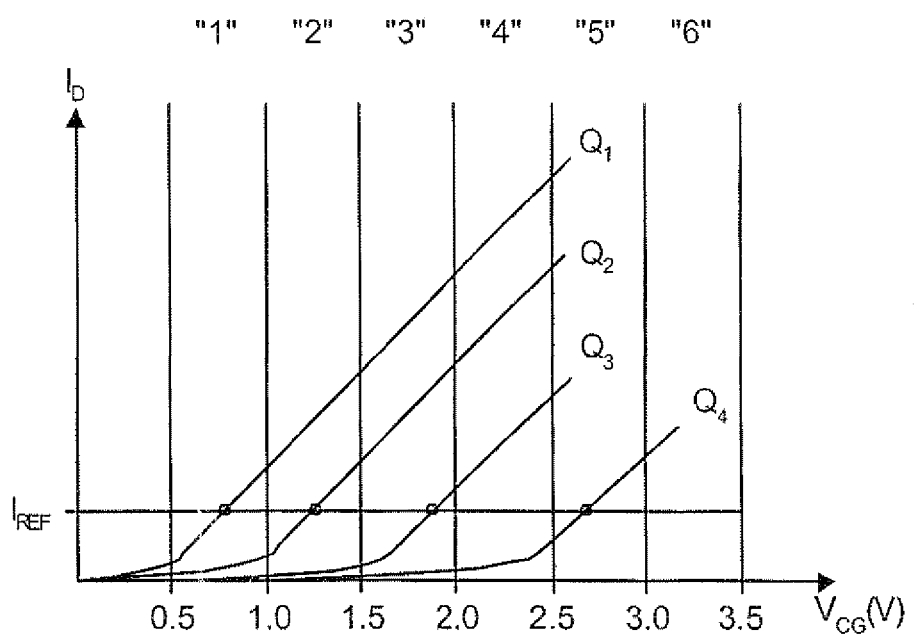
FIG. 4 illustrates the relation between the source-drain current and the control gate voltage for four different charges Q1-Q4 that the floating gate may be storing at any one time.
Figure 5:
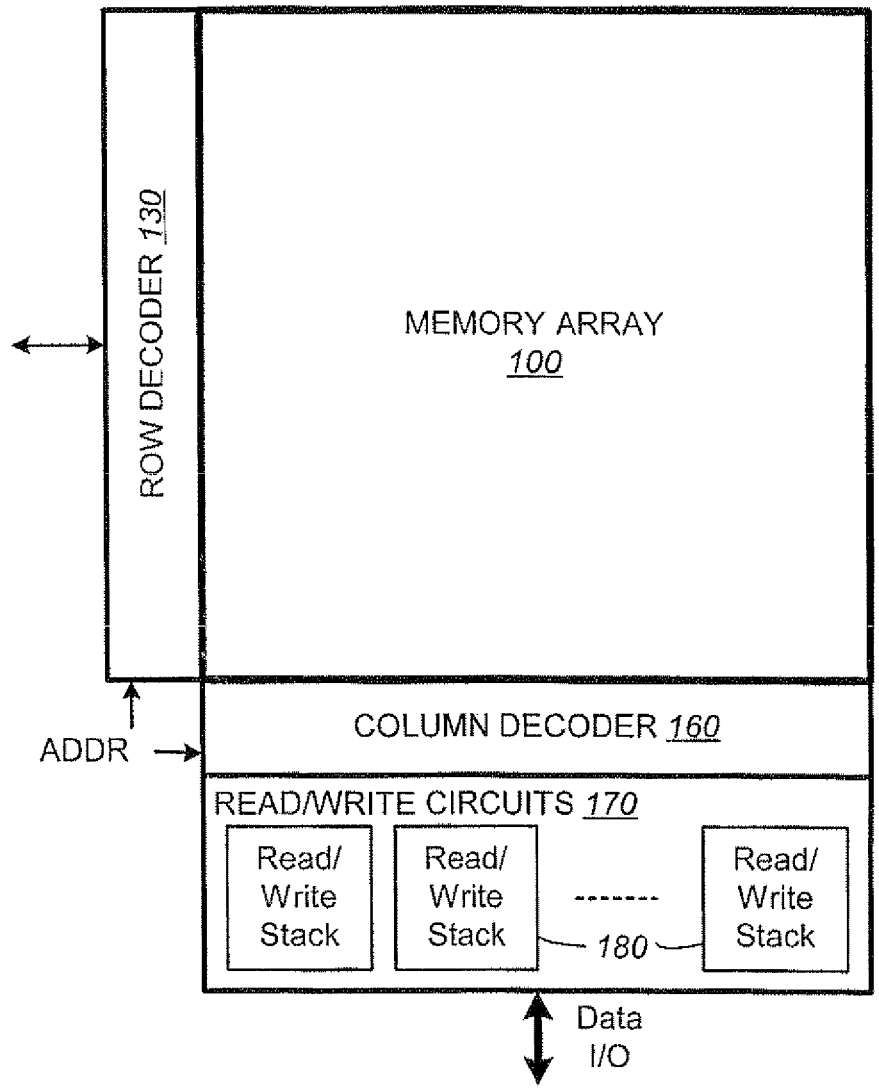
FIG. 5 illustrates schematically a typical arrangement of a memory array accessible by read/write circuits via row and column decoders.
Figure 6A:
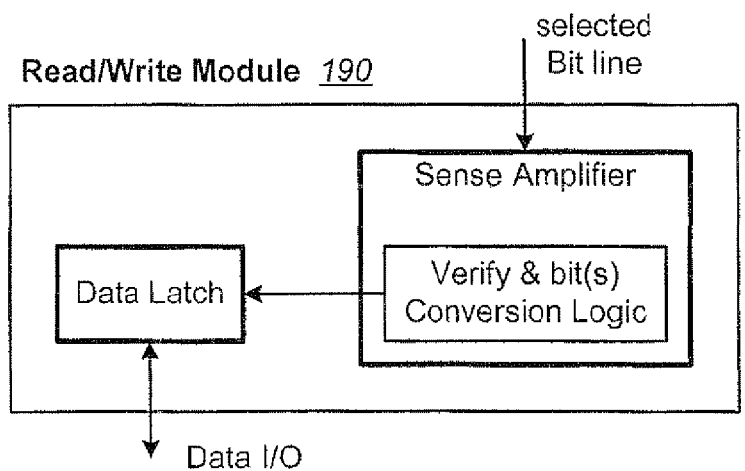
FIG. 6A is a schematic block diagram of an individual read/write module.
Figure 6B:
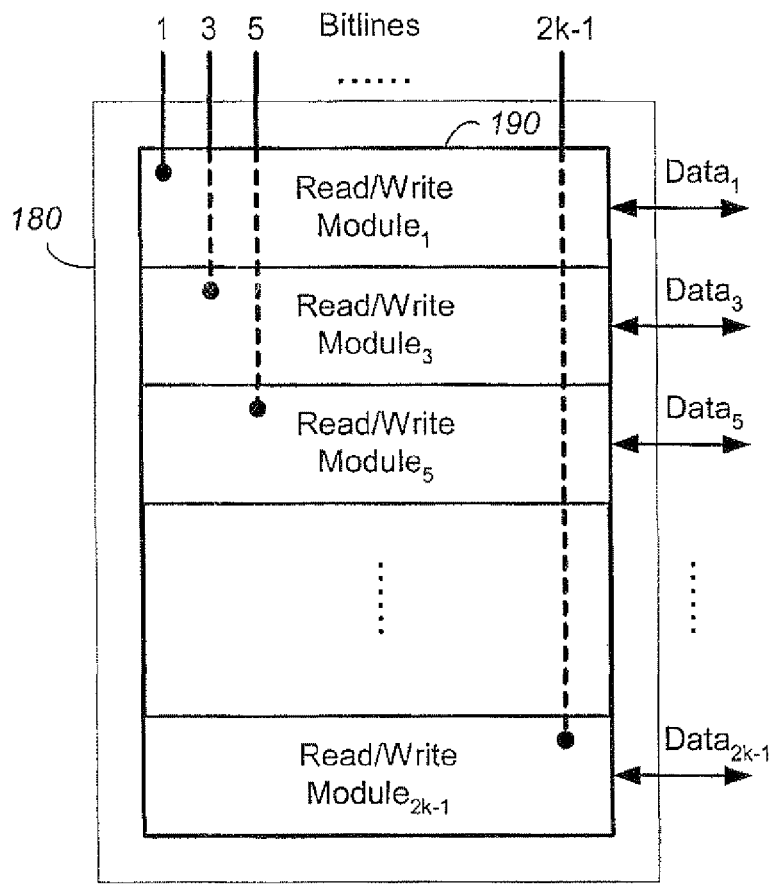
FIG. 6B shows the read/write stack of FIG. 5 implemented conventionally by a stack of read/write modules.
Figure 7A:
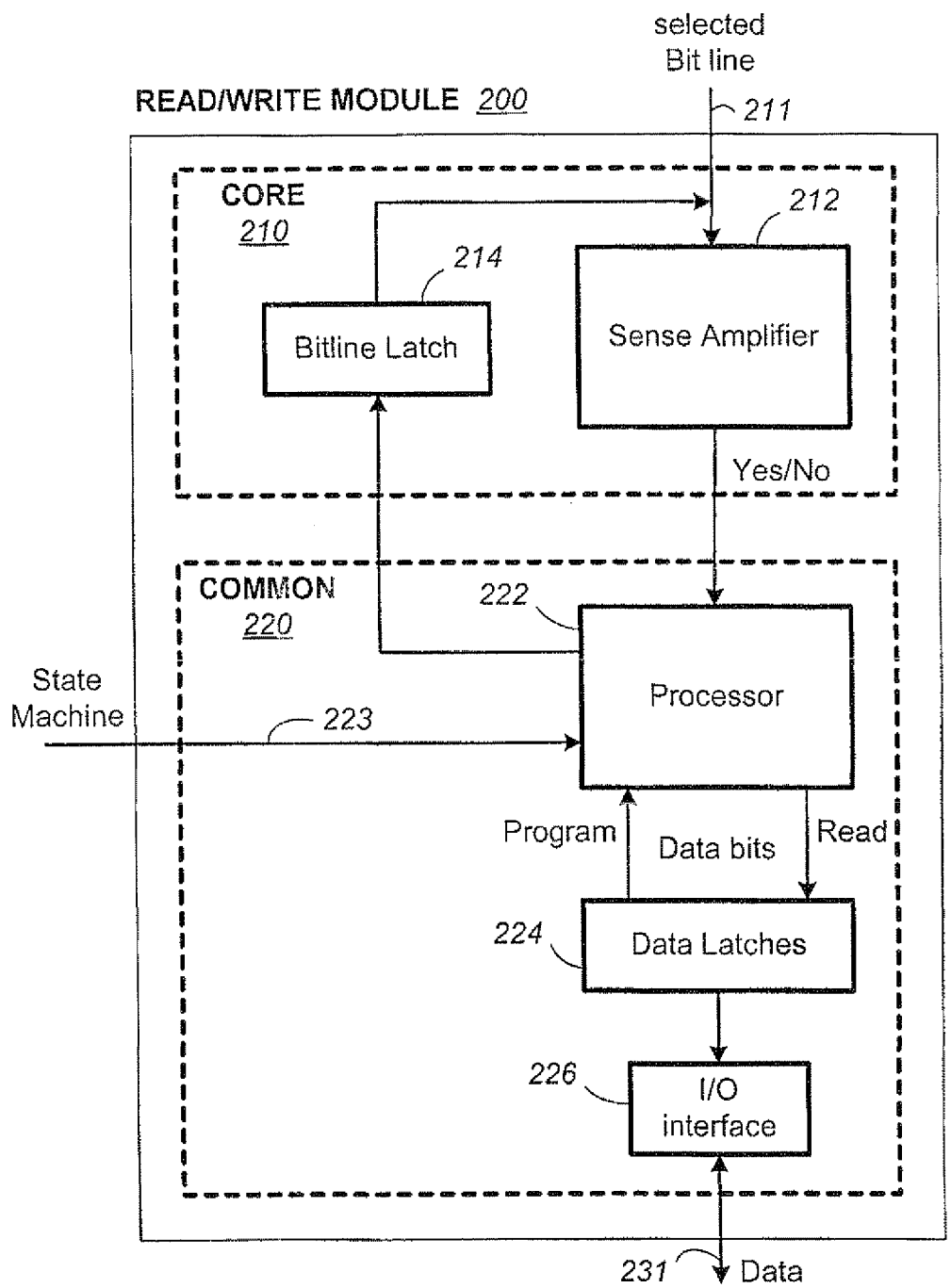
FIG. 7A is a schematic block diagram of an individual read/write module partitioned into a core portion and a common portion, according to a preferred embodiment of the present invention.

FIG. 7A is a schematic block diagram of an individual read/write module 200 partitioned into a core portion 210 and a common portion 220, according to a preferred embodiment of the present invention. The core portion 210 comprises a sense amplifier 212 that determines whether a conduction current in a connected bit line 211 is above or below a predetermined threshold level. As described in an earlier section, the connected bit line 211 enables access to the drain of an addressed memory cell in an array.

In one embodiment, the core portion 210 also includes a bit line latch 214. The bit line latch is used to set a voltage condition on the connected bit line 211. In one implementation, a predetermined state latched in the bit line latch will result in the connected bit line 211 being pulled to a state designating program inhibit (e.g., $V_{dd}$.) This feature is used for program inhibition as will be described later.

The common portion 220 comprises a processor 222, a set of data latches 224 and an I/O Interface 226 coupled between the set of data latches 224 and a data bus 231. The processor 222 performs computations. For example, one of its functions is to determine the memory state of the sensed memory cell and stores the determined data into the set of data latches. As explained in the background section, a memory cell can hold a range of charge and therefore can be programmed to any threshold voltage level (i.e., the control gate voltage that just turns on the cell to a predetermined conduction current) within a threshold voltage window. The set of data latches 224 is used to store data bits determined by the processor during a read operation. It is also used to store data bits imported from the data bus 231 during a program operation. The import data bits represent write data meant to be programmed into the memory. The I/O interface 226 provides an interface between the set of data latches 224 and the data bus 231.

During read or sensing, the operation is under the controller of a state machine that basically controls the supply of different control gate voltages to the addressed cell. As it steps through the various predefined control gate voltages corresponding to the various memory states supported by the memory, the sense amplifier 212 will trip at one of these voltages. At that point the processor 222 determines the resultant memory state by consideration of the tripping event of the sense amplifier and the information about the applied control gate voltage from the state machine via an input line 223. It then computes a binary encoding for the memory state and stored the resultant data bits into the set of data latches 224.

Figure 7B:
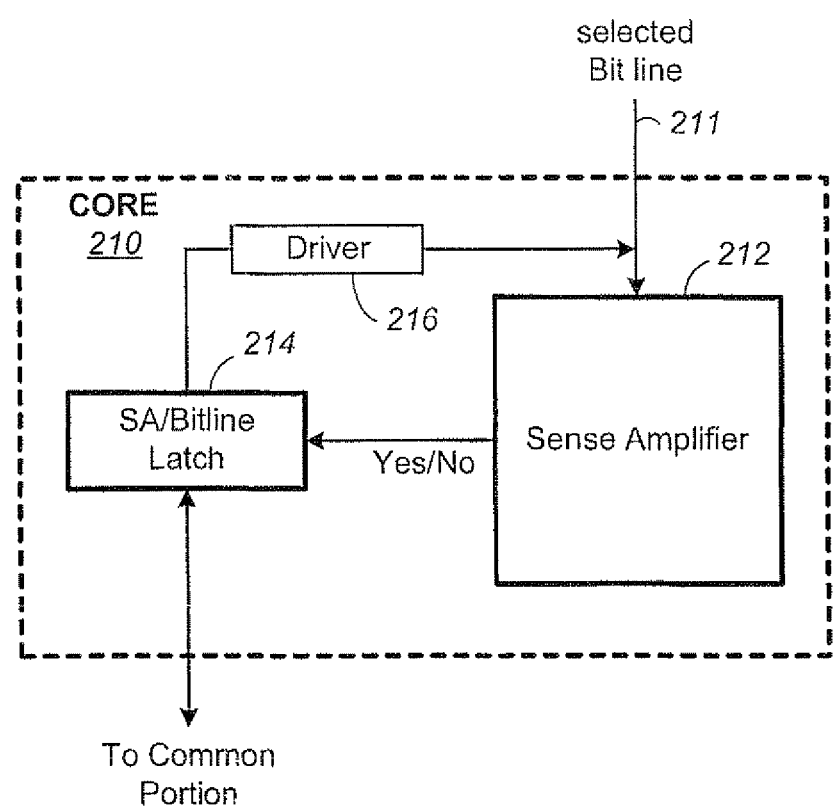
FIG. 7B illustrates another preferred embodiment of the core portion of the read/write module shown in FIG. 7A.

FIG. 7B illustrates another, preferred embodiment of the core portion of the read/write module shown in FIG. 7A. Essentially, the SA/bit line latch 214 serves double duty both as a latch for latching the output of the sense amplifier 212, and also as a bit line latch as described in connection with FIG. 7A. Thus, it can either be set by the sense amplifier or by the processor. In a preferred implementation, the signal from the SA/bit line latch 21.4 is driven by a driver 216 to set the voltage of the selected bit line 211.

Referring to FIG. 7A, during program or verify, the data to be programmed is inputted into the set of data latches 224 from the data bus 231. The program operation, under the controller of the state machine comprises a series of programming voltage pulses applied to the control gate of the addressed cell. Each programming pulse is followed by a read back to determine if the cell has been programmed to the desired memory state. The processor 222 monitors the read back memory state relative to the desired memory state. When the two are in agreement, the processor 222 sets the bit line latch 214 so as to cause the bit line to be pulled to a state designating program inhibit. This inhibits the cell coupled to the bit line from further programming even if programming pulses appear on its control gate.

The I/O interface 226 enables data to be transported in or out of the set of data latches 224. As will be seen in FIGS. 8A, 8B and 9, a block of read/write modules are used in parallel on a memory device to read or program a block of data at a time. Typically, the block of read/write modules has its individual sets of data latches combined to form a shift register so that the data latched by the block of read/write modules can be transferred out serially to the data bus 231. Similarly, program data for the block of read/write modules can be serially input from the data bus 231 and latched into the respective set of data latches.

Other specific implementations of the read/write module 200 is disclosed in co-pending and commonly assigned U.S. patent application, NON-VOLATILE MEMORY AND METHOD WITH REDUCED NEIGHBORING FIELD ERRORS, by Raul-Adrian Cernea and Yan Li, filed on the same day as the present application. The entire disclosure of said application is hereby incorporated herein by reference.

Compact Read/Write Circuits

One important feature of the present invention, for a block of read/write modules operating in parallel, is the partitioning of each module into a core portion and a common portion, and having the block of core portions operating and sharing with substantially lesser number of common portions. This architecture allows duplicative circuits among the individual read/write modules to be factored out, thereby saving space and power. In high density memory chip designs, the saving in space can be as much as fifty percent of the entire read/write circuits for the memory array. This allows the read/write modules to be densely packed so that they can simultaneously serve a contiguous row of memory cells of the memory array.

Figure 8A:
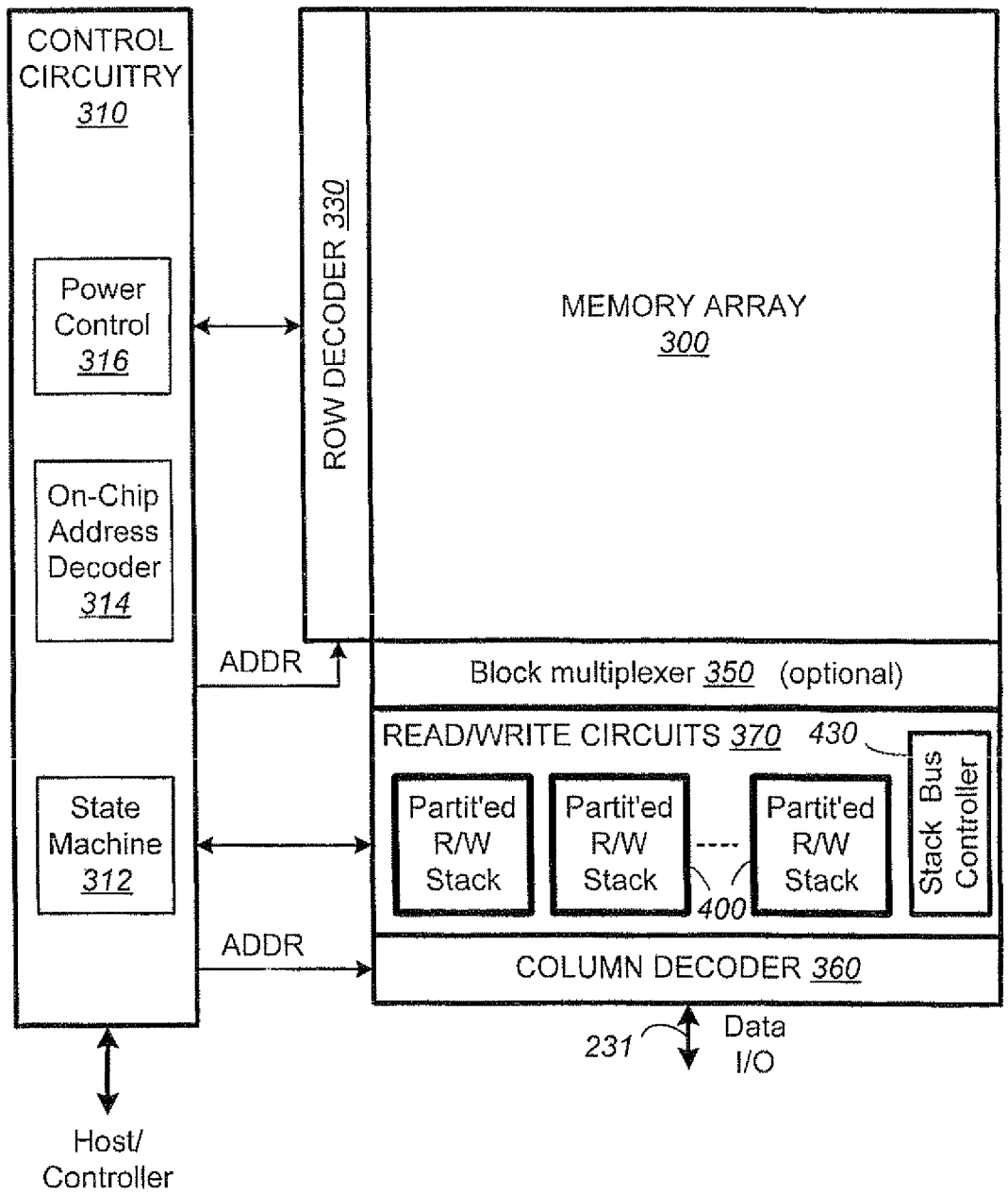
FIG. 8A illustrates schematically a compact memory device having a bank of partitioned read/write stacks, according to one embodiment of the present invention.

FIG. 8A illustrates schematically a compact memory device having a bank of partitioned read/write stacks, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 is implemented as a bank of partitioned read/write stacks 400 and allows a block of memory cells to be read or programmed in parallel. In one embodiment, where a row of memory cells are partitioned into multiple blocks, a block multiplexer 350 is provided to multiplex the read/write circuits 370 to the individual blocks. As will be described in more detail later, communication among a read/write stack 400 is effected by a stack bus and controlled by a stack bus controller 430.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 8B:
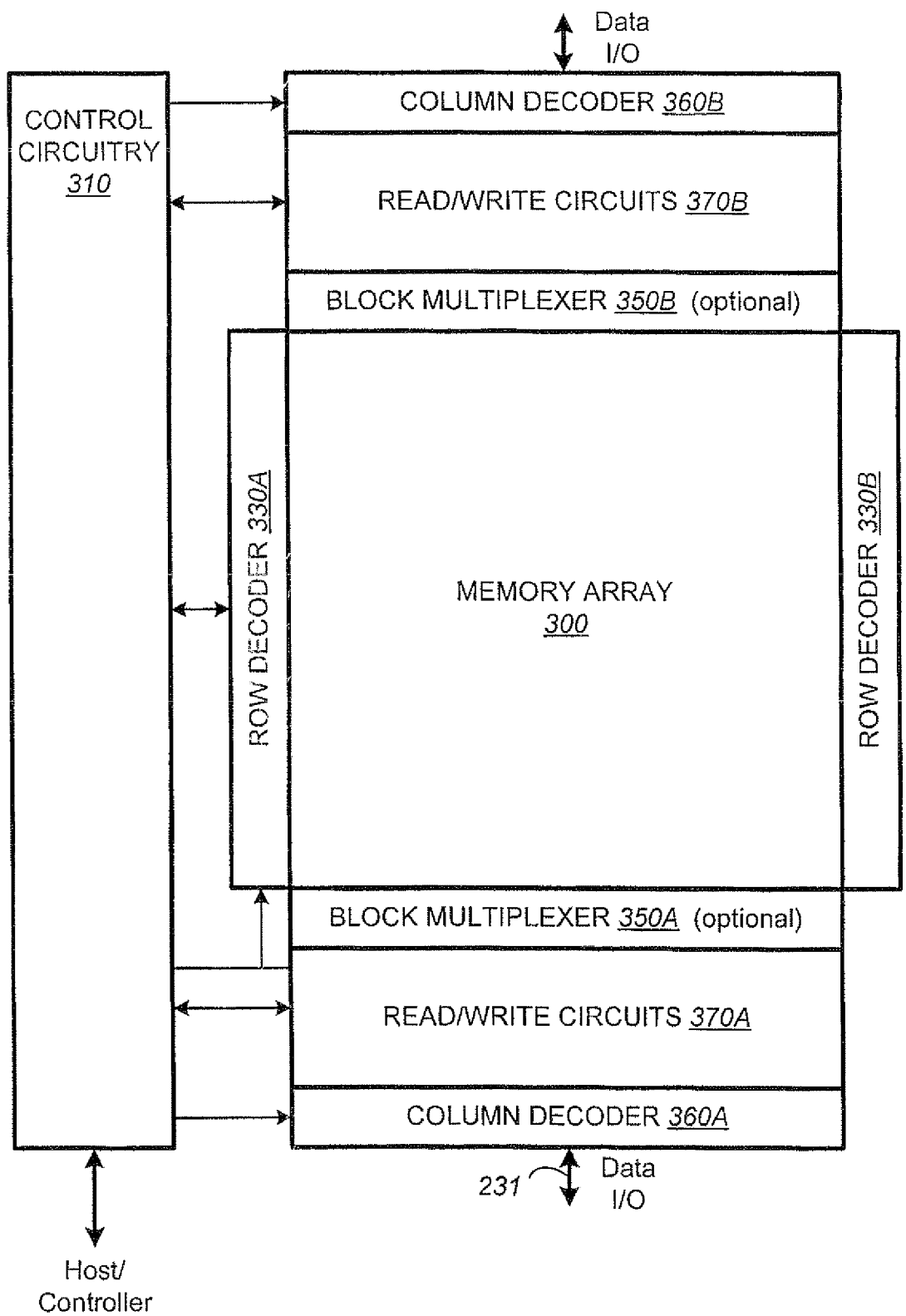
FIG. 8B illustrates a preferred arrangement of the compact memory device shown in FIG. 8A.

FIG. 8B illustrates a preferred arrangement of the compact memory device shown in FIG. 8A. Access to the memory array 300 by the various peripheral circuits is implemented in a symmetric fashion, on opposite sides of the array so that access lines and circuitry on each side are reduced in half. Thus, the row decoder is split into row decoders 330A and 330B and the column decoder into column decoders 360A and 360B. In the embodiment where a row of memory cells are partitioned into multiple blocks, the block multiplexer 350 is split into block multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the partitioned read/write stacks 400, is essentially reduced by one half.

Figure 9:
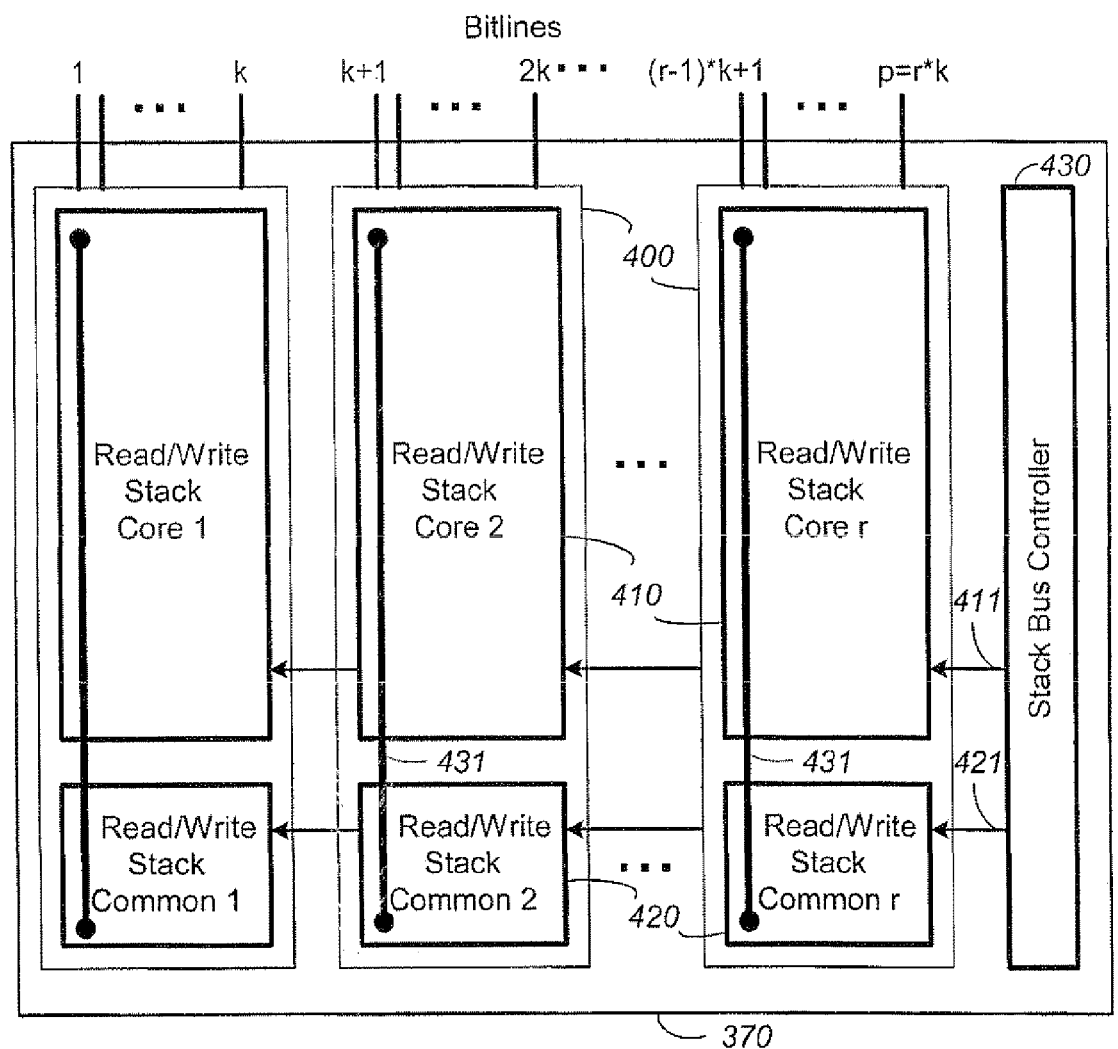
FIG. 9 illustrates schematically in more detail the read/write circuits shown in FIG. 8A or 8B being organized into a bank of partitioned read/write stacks.

FIG. 9 illustrates schematically in more detail the read/write circuits shown in FIG. 8A or 8B being organized into a bank of partitioned read/write stacks. Each partitioned read/write stack 400 essentially contains a stack of read/write modules servicing a segment of k memory cells in parallel. Each stack is partitioned into a core stack portion 410 and a common stack portion 420. Communication among each read/write stack 400 is effected by an interconnecting stack bus 431 and controlled by the stack bus controller 430. Control lines 411 provide control and clock signals from the stack bus controller 430 to each of the core portion of the read/write stacks 410. Similarly, control lines 421 provide control and clock signals from the stack bus controller 430 to each of the common portion of the read/write stacks 420.

The entire bank of partitioned read/write stacks 400 operating in parallel allows a block of p cells along a row to be read or programmed in parallel. For example, if r is the number of stacks in the bank, then p=r*k. One example memory array may have p=512 bytes (512×8 bits), k=8, and therefore r=512. In the preferred embodiment, the block is a run of the entire row of cells. In another embodiment, the block is a subset of cells in the row. For example, the subset of cells could be one half of the entire row or one quarter of the entire row. The subset of cells could be a run of contiguous cells or one every other cell, or one every predetermined number of cells.

In the embodiment shown in FIG. 8A, there will be p number of read/write modules, one for each of the block of p cells. As each stack is serving k memory cells, the total number of read/write stacks in the bank is therefore given by r=p/k. In the example where p=512 bytes and k=8, r will be 512.

As mentioned earlier, one problem encountered in high density and high performance memory is the need for reading and programming a block of contiguous row of cells in parallel and the difficulty in accommodating a read/write module for every cell.

The accommodation problem is alleviated by a preferred embodiment shown in FIG. 8B in which the peripheral circuits are formed on opposite sides of the memory array. When the read/write circuits 370A, 370B are formed on opposite sides of the memory array 300, half of the block of p cells will then be accessed from the top and the other half from the bottom side of the array. Thus, there will be p/2 number of read/write modules on each side. It follows that the read/write stacks 400 on each side will need only serve p/2 number of bit lines or memory cells in parallel, thus the total number of read/write stacks in the bank is given by r=p/2 k. In the example where p=512 bytes and k=8, r will be 256. This means that only half as many read/write stacks 400 are required on each side of the memory array compared to the embodiment shown in FIG. 8A.

In other embodiments, where accommodation or other considerations dictate even lower density, a row of cells is partitioned into two or more interleaving blocks of cells. For example, one block of cells consists of cells from even columns and the other block of cells from odd columns. As shown in FIGS. 8A and 8B, the block multiplexer 350 or 350A and 350B will be used to switch the bank of partitioned read/write stacks to either the even or odd block. In the embodiment shown in FIG. 8B, there will be p/4 number of read/write modules on each side of the array. In this case, the number of read/write stacks on each of the opposite sides will be r=p/4 k. Thus, more room is provided to fit the fewer read/write modules, but at the expense of reduced performance and that the read/write block is no longer contiguous.

Figure 10:
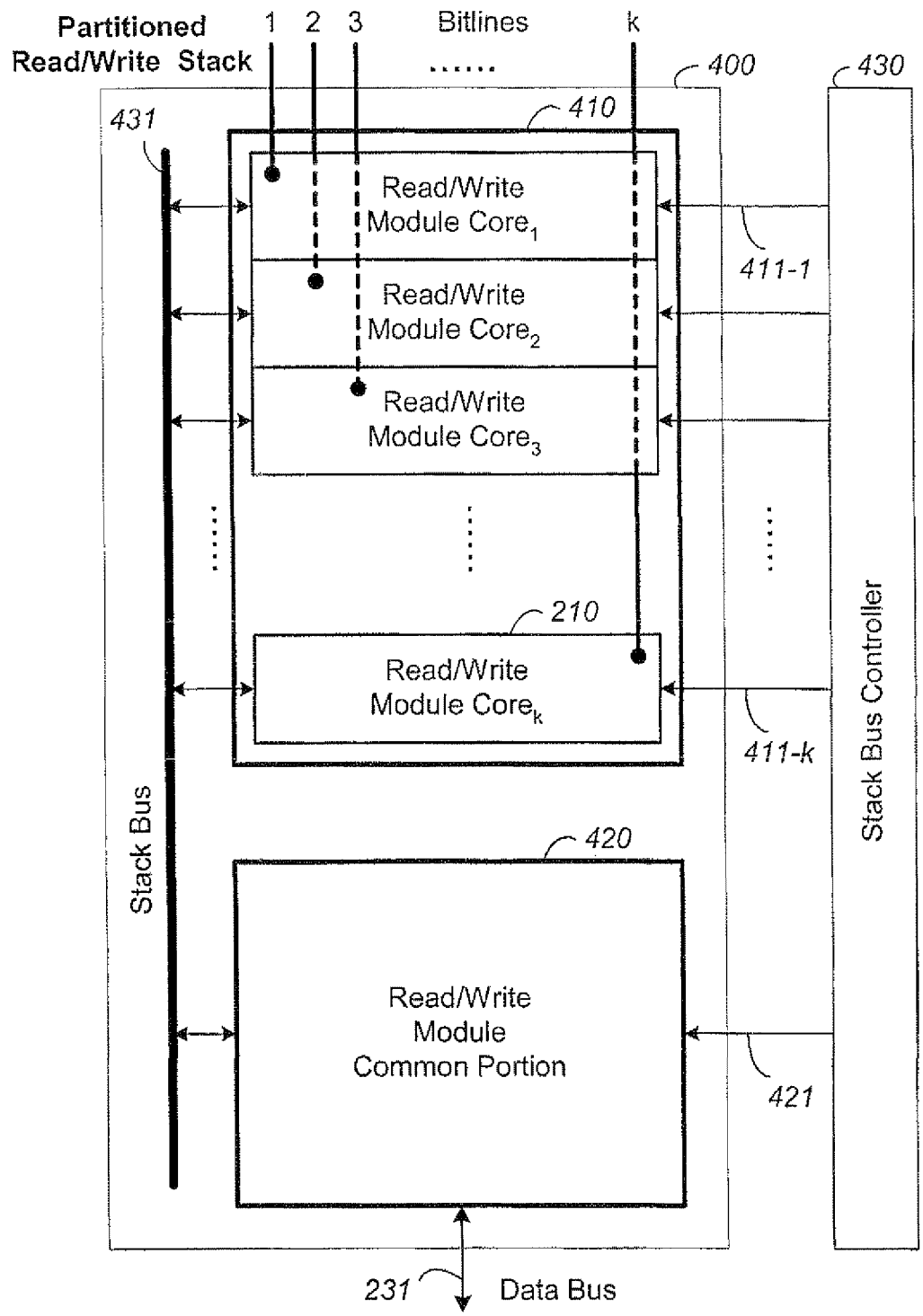
FIG. 10 shows in more detail a partitioned read/write stack constituted from a stack of read/write modules.

FIG. 10 shows in more detail a partitioned read/write stack constituted from a stack of read/write modules. The partitioned read/write stack 400 essentially includes k number of read/write modules, serving k number of memory cells via k number of bit lines. As can be seen from the read/write module 200 shown in FIG. 7, it contains many more circuit elements than a memory cell and therefore will not be able to be accommodated within a column whose width is essentially defined by that of a memory cell. Depending on the sophistication and features of the read/write module 200, it can easily occupy, for example, between eight to sixteen or more columns (i.e., k~8 to 16 or more.) Each read/write module has a width that straddles over a sufficiently number of columns such as k. This means that an equal number of modules, k, will have to be stacked up within those straddled columns in order to service each column. For example, if each read/write module has a width of 16 columns, then for the embodiment shown in FIG. 8A, where the read/write circuits are only on one side, the stack will contain sixteen read/write modules. In the preferred embodiment shown in FIG. 8B, where the read/write circuits are formed on both top and bottom of the array so that eight bit lines are accessed at each end, the stack will be eight-read/write module deep.

One important feature of the invention is to implement sophisticated read/write modules 200 that are at the same time highly compact. This is made possible by partitioning the block of p read/write modules into p read/write module core portions 210 sharing a much smaller number of (i.e., r) read/write modules common portions 220. (See FIG. 7 and FIG. 10.)

FIG. 10 illustrates that a read/write stack 400 serving k bit lines is partitioned into a stack core portion 410 and a stack common portion 420. The stack core portion 410 contains k read/write module cores, each such as the core 210 shown in FIG. 7A or FIG. 7B. The stack common portion 420 contains one read/write module common portion such as the common portion 220 shown in FIG. 7A. The partitioning into core portions and common portions is based on the principle that core portions are all operated simultaneously or in parallel. In this case, it will include the sense amplifier 212 and SA/bit line latch 210 (See FIG. 7B), as the corresponding block of memory cells are sensed in parallel. After the block of memory cells are sensed in parallel, the sensed results can be processed by the relatively fewer common portions in a serial manner.

Communication between each of the core portions 210 and the common portion 420 is through the stack bus 431 under the control of the stack bus controller 430. This is accomplished by control lines such as 411-k and 421 from the controller running to all stacks in the bank.

This sharing scheme avoids redundancy in the read/write circuits. If k=8, then roughly seven out of eight common portions within each stack are no longer needed. In terms of the entire read/write circuits, this amounts roughly to doing away with a total of r*(k−1) common portions, resulting in substantial saving in space on the integrated memory chip. As mentioned before, this could result in reducing the space occupied by the read/write circuits by as much as fifty percent.

Figures 11A, 11B:
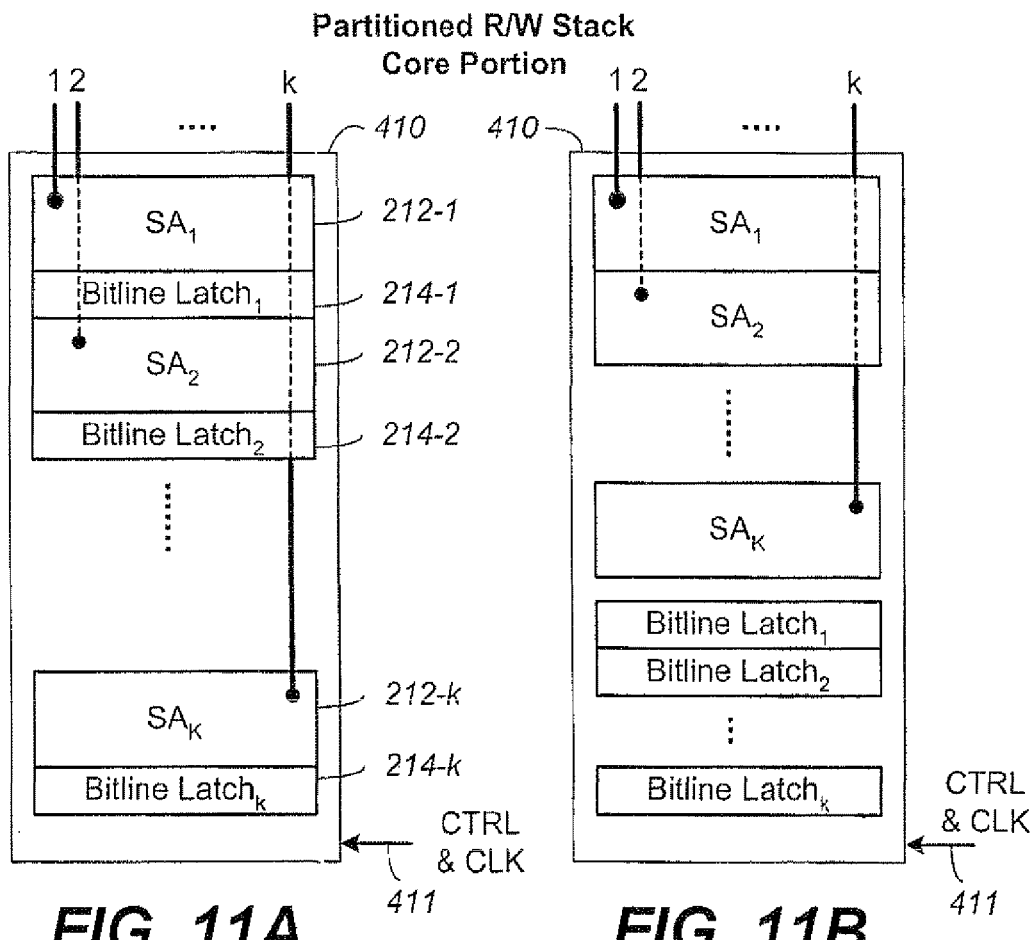
FIG. 11A illustrates one embodiment of a read/write stack core 410 shown in FIG. 10, in which each sense amplifier in the stack is located adjacent to its associated bit line latch.
FIG. 11B illustrates another embodiment of a read/write stack core 410 shown in FIG. 10, in which the individual sense amplifiers in the stack form one cluster and the individual bit line latches form another cluster.

FIG. 11A illustrates one embodiment of a read/write stack core 410 shown in FIG. 10, in which each sense amplifier in the stack is located adjacent to its associated bit line latch. The sense amplifiers and the bit latches are similar to those shown in the read/write module core portion 210 in FIG. 7. The read/write stack core 410 contains k sense amplifiers 212-1 to 212-k and k bit line latches 214-1 to 214-k, and is organized such that a bit line latch is adjacent to a sense amplifier serving the same bit line. For example, bit line latch 214-1 is adjacent sense amplifier 212-1, both being coupled to the bit line 1. Each of the bit line latches and sense amplifiers communicates with other components in the read/write stack 400 through the stack bus 431 (see FIG. 10).

FIG. 11B illustrates another embodiment of a read/write stack core 410 shown in FIG. 10, in which the individual sense amplifiers in the stack form one cluster and the individual bit line latches form another cluster. The read/write stack care 410 contains k sense amplifiers 212-1 to 212-k and k bit line latches 214-1 to 214-k. The read/write stack core 410 is organized such that all the k bit line latches are in a cluster adjacent each other and all the k sense amplifiers are in another cluster adjacent each other. For example, the bit line latches 214-1 to 214-k form one cluster and the sense amplifiers 212-1 to 212-k form another cluster. Each of the bit line latches and sense amplifiers communicates with other components in the read/write stack 400 through the stack bus 431 (see FIG. 10) under the control of the stack bus controller via control lines 411.

Figure 12:
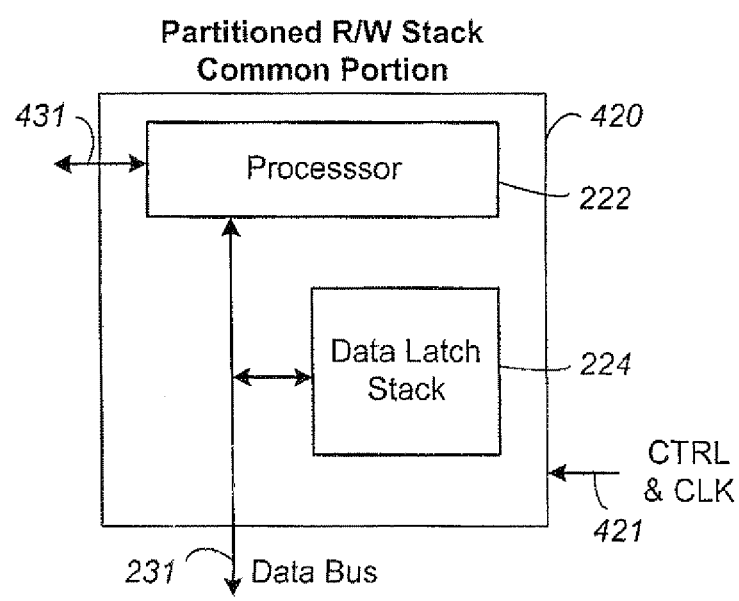
FIG. 12 shows in more detail the read/write stack common portion shown in FIG. 10.

FIG. 12 shows in more detail the read/write stack common portion shown in FIG. 10. The read/write stack common portion 420 essentially contains one copy of the read/write module common portion such as the common portion 220 shown in FIG. 7. It comprises a processor 222, a data latch stack 224. In one embodiment, the data bus 231 is coupled to the processor 222 and the data latch stack 224 while also coupled to the stack bus 431 via the processor 222. In another embodiment, the data bus 231 is an extension of the stack bus 431. The stack bus 431 (see FIG. 10) enables communication between the read/write stack core portion 410 and the common portion 420. In this way, the individual read/write module cores 210 are able to share the common portion 420. The operation of the processor 222 and the data latch stack 224 and the stack bus 431 are controlled by control and clock signals from the stack bus controller via the control lines 421.

The operations of the various components in the partitioned read/write stack 400 are similar to that described generally in connection with the partitioned read/write module 200 in FIG. 7. A sophisticated and feature rich read/write module is possible because of the space saved in sharing a stack common portion among multiple read/write module cores. For example, the processor 222 can also be used to perform refined margining estimations as well as static and dynamic data processing, including error corrections.

Stack Bus

According to another aspect of the invention, a serial bus is provided for communication between the various portions within a partitioned read/write stack 400. The serial bus 431 interconnects the read/write module common portion 420 with anyone of the read/write module cores 410 under the control of the stack bus controller 430. The stack bus controller 430 serves as a bus master controlling when and where data are transferred between the various portions within the read/write stack 400.

Referring to FIGS. 10-12, when a memory cell is addressed, its source-drain current is sensed by one of the sense amplifiers such as sense amplifier 212-k. The digital output of the sense amplifier 212-k is put on the stack bus 431, which is then picked up by the processor 222. The bus timing is controlled by the stack bus controller 430. The processor 222 processes the sense amplifier output data together with related state information to obtain a binary read data for the addressed cell. The binary data will then be placed on the stack bus 431 and be picked up by the data latches associated with the bit line k. Again, the stack bus controller 430 ensures that the binary data derived, from the sense amplifier 212-k goes to the data latches associated with it.

In the verify step of a programming operation the digital signal of the sense amplifier indicates whether the addressed memory cell has been programmed to the desired level. If the desired level has been achieved, then the processor 222 sends a control signal via the stack bus 431 to the corresponding bit line latch. For example, bit line latch 214-k may be set to a state corresponding to the bit line k being pulled to a predetermined voltage (e.g., $V_{dd}$) to prevent further programming of the coupled memory cell. In another embodiment, a program lockout latch may be implemented by a dedicated latch, not necessarily coupled to control the voltage on the bit line, but coupled to control the programming voltages through an addressed word line.

The partitioning and sharing of a common portion 420 by k read/write module cores 210 predicates that a communication channel be established between the partitioned portions. Referring to FIG. 7, it can be seen that there are at least two connections between the core portion 210 and the common portion 220. Thus, it would seem that at least 2 k connections are needed. These are in addition to the k bit line connections giving a total of 3 k connections to be provided within the k to 2 k columns' width. Thus at the very least, each column must accommodate 1.5 conductive lines. Generally, it is preferably to have a minimum of conductive lines within each column so that the width, and therefore the conductivity, of each line is maximized.

The implementation of the stack bus 431 allows a reduced number of communication lines for the various portions of the partitioned read/write stack 400. In the preferred embodiment, a serial bus implementation with only one line is used. In this way for each stack occupying 2 k columns, only one conductive line is required in addition to k existing bit lines, amounting to a total of k−1 conductive lines. This can result in each column having to accommodate approximately 0.5 conductive line, which means that each conductive line can be approximately two-column wide. A read/write stack with a serial-bus architecture also allows more freedom of layout so that the placement of the individual portions within the stack (See for example FIGS. 11A and 11B) can be optimized according to a given consideration.

Compact I/O Enabled Data Latch Stack

According to another aspect of the invention, a set of I/O enabled data latches associated with the block of read/write sense amplifiers are implemented as part of a space efficient shift registers.

As described earlier, in a read operation, the output signal of the sense amplifier 212 is interpreted by the processor 222 and converted to binary format. In a two-state memory implementation, the converted data amounts to one bit of binary data. In multi-state implementations, the converted binary data will be more than one bit. Therefore, for each bit of binary data, there will be a corresponding data latch among a set of data latches. During a program operation, the same set of data latches is used as the program data latches. The data to be programmed is sent from the host/controller via the data bus to the memory chip and is stored in the same set of data latches. For purpose of the present description, it will be understood that the latch is an array in the multi-state case.

Referring to FIG. 12, the compact data latch stack 224 contains a stack of k data latches corresponding to the k sense amplifiers. Since these data latches exchange its read data or write data with the data bus 231, it is preferable to implement the data latch stack as a shift register so that the parallel data stored therein is converted to serial data for the data bus, and vice versa. In the preferred embodiment, all the data latches corresponding to the read/write block of p memory cells can be linked together to form a block shift register so that a block of data can be input or output by serially transferred in or out of the data bus. In particular, the bank of r read/write stacks is timed so that each of its set of data latches will shift data in to or out of the data bus in sequence as if they are part of a shift register for the entire read/write block.

Figures 13A, 13B:
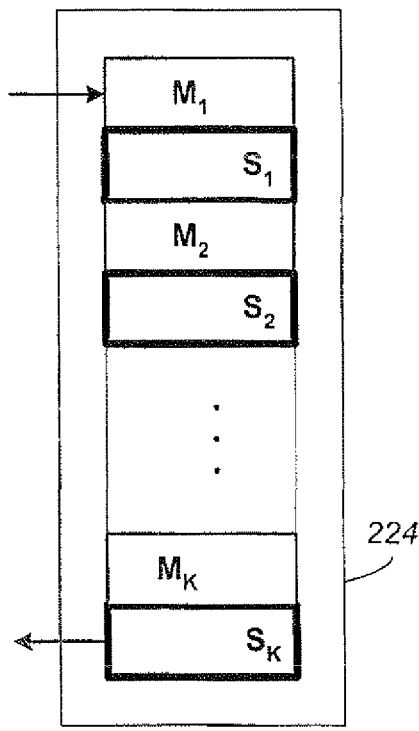
FIG. 13A illustrates a conventional implementation of a shift register.
FIG. 13B is a table illustrating the loading of data into a data latch stack implemented with the master-slave flip-flops of FIG. 13A.

FIG. 13A illustrates a conventional implementation of a shift register. A shift register is implemented as a series of master-slave flip-flops $M_1, S_1, \ldots M_k, S_k$. When the data latch stack 224 is implemented with this type of shift register, data are shifted in serially through the series of master-slave flip-flops. At each clock edge, all flip-flops in the chain is operated synchronously and the data in the chain is shifted by one flip-flop. Assigning a slave to each master flip-flops, ensure the content of each master to be copied to the slave before the master is itself written over. This type of shift register may be regarded as a "2 k shift latch" as it has a two-fold overhead in that it requires 2 k storage for holding and shifting k number of data bits.

FIG. 13B is a table illustrating the loading of data into a data latch stack implemented with the master-slave flip-flops of FIG. 13A. A sequence of clock signals, $CLK_1$, $CLK_2$, $CLK_3$, is provided by the latch stack controller 224 (see FIG. 10) and applied to all the flip-flops as serial data. $D_1, D_2, D_3, \ldots$ are fed into the shift register. In the first clock cycle $CLK_1$ the first data $D_1$ is latched into the first master flip-flop $M_1$. At the falling edge of the first clock signal $CLK_1^*$, the data $D_1$ in $M_1$ is also latched into the first slave flip-flop $S_1$. In the second clock cycle $CLK_2$ the next data $D_2$ is loaded into $M_1$, as the first data $D_1$ is loaded from $S_1$ into the second master flip-flop $M_2$. Subsequent steps are straightforward repetitions of the previous steps, as illustrated, until all items of data are shifted into the latch stack 224. It can be seen that loading of k items of data requires k clock cycles.

It will be understood that for multi-state memory, each of the master flip-flops, M, and the slave flip-flops, S, becomes an array with a dimension commensurate with the number of data bits required. For example, for a 4-state memory cell, the states will be encoded by two binary bits of data. M represents $M(1)$ and $M(2)$ and S represents $S(1)$ and $S(2)$ for each of the two bits respectively. Thus the "2 k shift latch" will be formed by $M_1(1), S_1(1), M_1(2), S_1(2), M_2(1), S_2(1), M_2(2), S_2(2), \ldots, M_k(1), S_k(1), M_k(2), S_k(2)$.

Figure 14A:
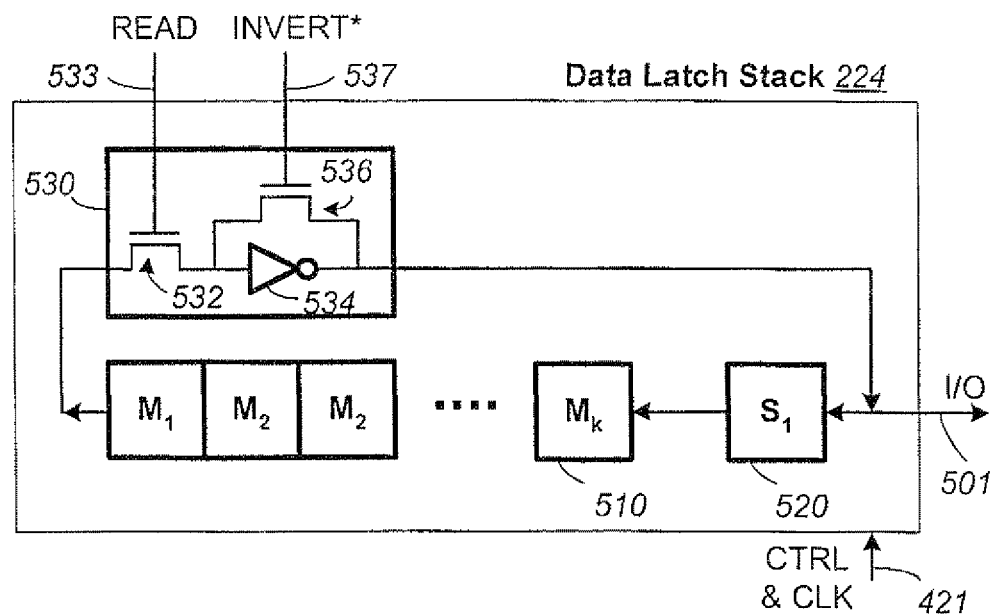
FIG. 14A illustrates one preferred embodiment of the compact latch stack.

FIG. 14A illustrates one preferred embodiment of the compact latch stack 224. The latch stack 224 includes a chain having a slave link module $S_1$ 520, followed by a series of master link modules $M_k, \ldots, M_2, M_1$ 510. The chain has an I/O end 501 at the slave link module $S_1$ 520. Data $D_1, D_2, \ldots, D_k$ is shift from the I/O line 510 into the chain and is shifted out of the chain from the $M_1$ end. The data output from $M_1$ is routed to the I/O line 501 through an output line driver 530.

The output line driver includes a transistor 532 gated by a READ signal in line 533 and an inverter 534 which is selectively shunt by a transistor 536. When a control signal INVERT* at a gate 537 of the transistor 536 is HIGH, the inverter 534 is active and inverts the output signal from $M_1$. Otherwise, the inverter 534 is bypassed and the output signal from $M_1$ appears at the I/O line 501. The control signals READ, INVERT* and other control and timing signals needed to operate the data latch stack 224 are provided by the stack bus controller 430 via the control lines 421 (see FIG. 12.)

The data latch stack 224 shown in FIG. 14A may be regarded as a "k+1" compact shift register, comprising k master link modules 510 for holding k bits of data and employing only one slave link module 520 to temporarily buffer data. The slave link module 520 is to facilitate shuffling of the items along the chain without losing the stored data in the process. This implementation of the latch stack helps reduce the number of latches needed by half as compared to the "2 k shift latch" of FIGS. 13A and 13B. In other embodiments to be described later, the k master link modules may share more than one slave link module, but generally with the number of slave modules substantially less than that of the master modules.

Figure 14B:
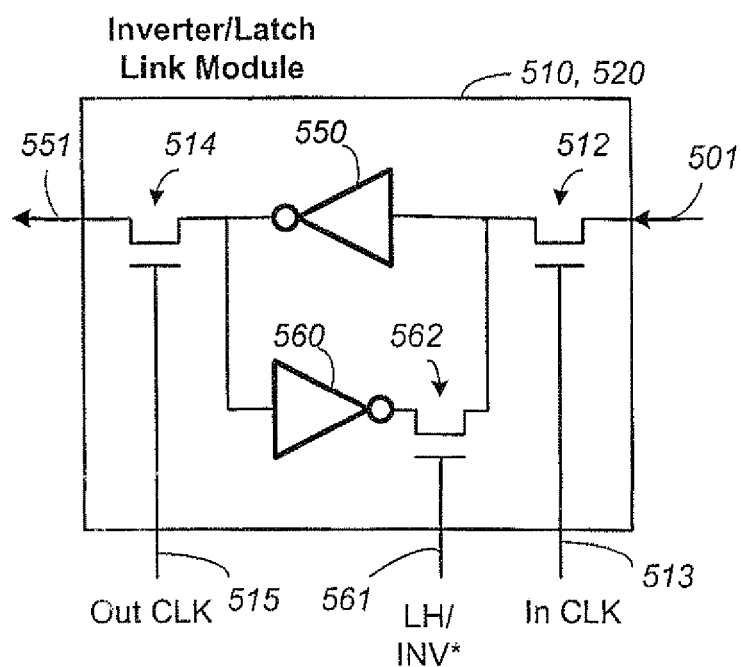
FIG. 14B shows one embodiment of the master or slave link module.

FIG. 14B shows one embodiment of the master or slave link module 510, 520. One novel feature of the link module is that it can selectively be made to behave as an inverter or a latch. The link module has an input 501 and an output 551. The input 501 receives data input from the output of a preceding link module in the chain. A transistor 512, controlled by a control signal InCLK, serves as a gate for the input data. When the control signal is HIGH, the data is admitted into the link module. When the control signal is LOW, the data is barred from the module. If the data is admitted, it is either latched into a latch formed by a pair of inverters 550, 560, or inverted by one of the inverter 550 while the other inverter 560 is disabled. The latched data is accessible at the output 551 but gated by a transistor 514, controlled by a control signal OutCLK.

Figure 14C:
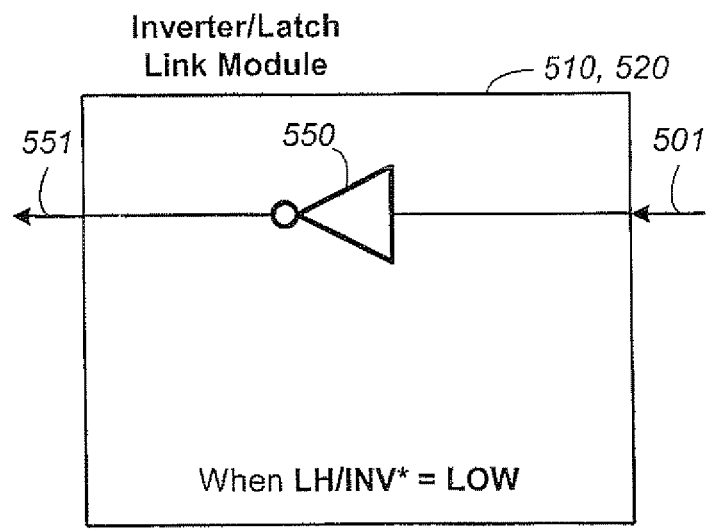
FIG. 14C illustrates schematically that the link module of FIG. 13B functions as a latch when the control signal LH/INV* is HIGH.

FIG. 14C illustrates schematically that the link module of FIG. 13B functions as a latch when the control signal LH/INV* is HIGH. The latch is enabled when the inverter 560 is selectively enabled by a serial transistor 562 with a control signal LH/INV* at its gate. The enabled inverter 560 together with the inverter 550 function as a latch, latching the input data.

Figure 14D:
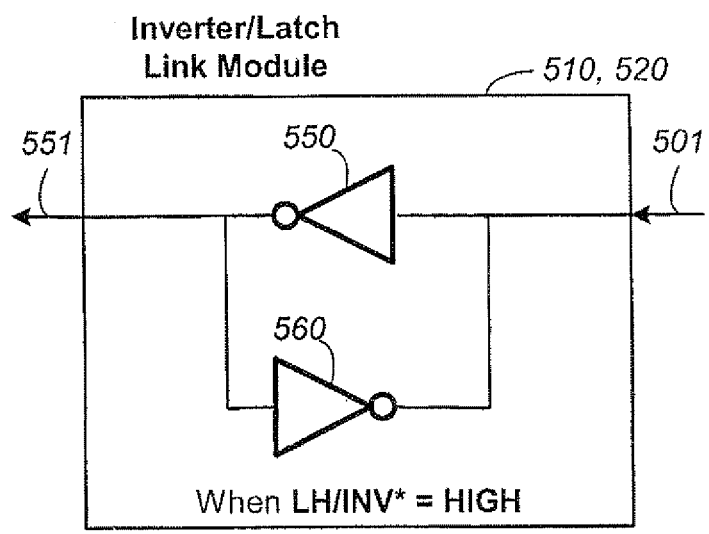
FIG. 14D illustrates schematically that the link module functions as an inverter when the control signal LH/INV* is LOW.

FIG. 14D illustrates schematically that the link module functions as an inverter when the control signal LH/INV* is LOW. In this case, the inverter 560 is disabled and the input data only passes through the inverter 550.

Each link module 510 or 520 in the chain can therefore selectively be an inverter or a latch. The input, latching or output of data by the chain is effected by appropriate control of its individual chain modules. The control signals are provided by the stack bus controller 430 via the control lines 421 (see FIG. 12.)

Figure 15A:
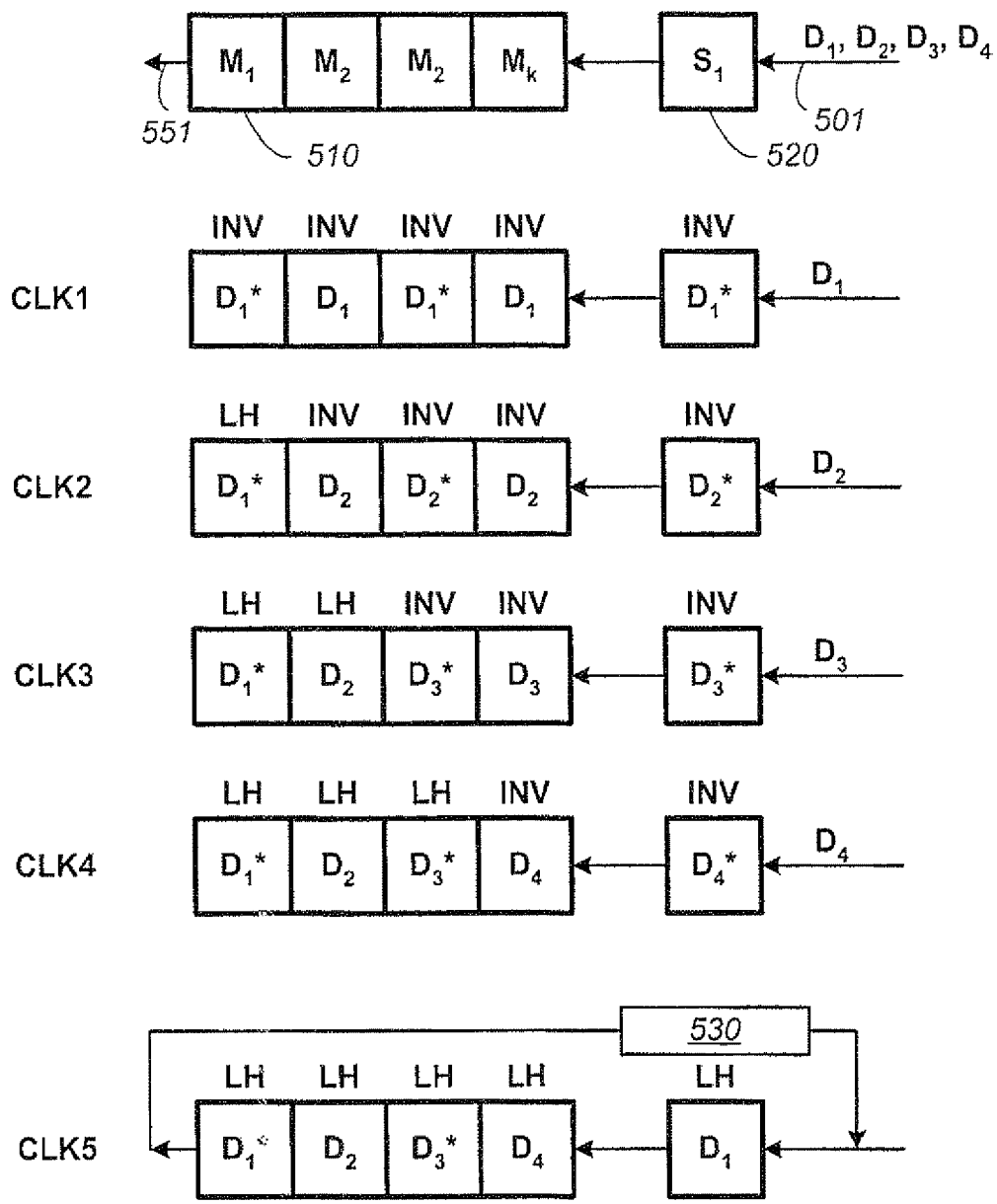
FIG. 15A illustrates the loading of four data bits into a data latch stack implemented with the compact data latch stack of FIG. 14A.

FIG. 15A illustrates the loading of four data bits into a data latch stack implemented with the compact data latch stack of FIG. 14A. Four data bits are used as an example, where k=4. In general, the data latch stack can hold a different number of data bits k as required. Prior to programming, the data latch stack is loaded with the data to be programmed, such as $D_1, D_2, D_3, D_4$ that are present sequentially on the I/O line 501 (see FIG. 14A) respectively at clock cycles, $CLK_1, CLK_2, CLK_3$ and $CLK_4$. Just prior to $CLK_1$, the states of the individual link modules $(M_1, M_2, M_3, M_4, S_1)$ are all set to behave as an inverter (see FIG. 14C) i.e., (INV, INV, INV, INV, INV). In this way, at $CLK_1$ the data $D^*_1$ is presented to $M_1$. At the next edge, $CLK^*_1$ (not shown explicitly) $M_1$ is turned into a latch (see FIG. 14D), holding $D^*_1$ and is decoupled from the chain. Just prior to CLK2, the states of the rest of the link modules in the chain are all set to behave as an inverter, i.e., (LH, INV, INV, INV, INV). In this way, the data $D^*_2$ is presented to $M_2$. At $CLK^*_2$ (not shown explicitly) $M_2$ is also turned into a latch, holding $D_2$ and is decoupled from the chain. Similar processes take place at $CLK_3$ and $CLK_4$ when $D^*_3$ and $D_4$ are latched into $M_3$ and $M_4$ respectively. Thus, after four clock cycles, four data bits are loaded into the four master chain modules $M_1, M_2, M_3, M_4$. In one preferred embodiment, an additional clock cycle, $CLK_5$ allows a copy of the data in $M_1$ to be saved in the slave chain module $S_1$. This is to facilitate a subsequent non-destructive mode readout described later in connection with FIG. 15C.

Figure 15B:
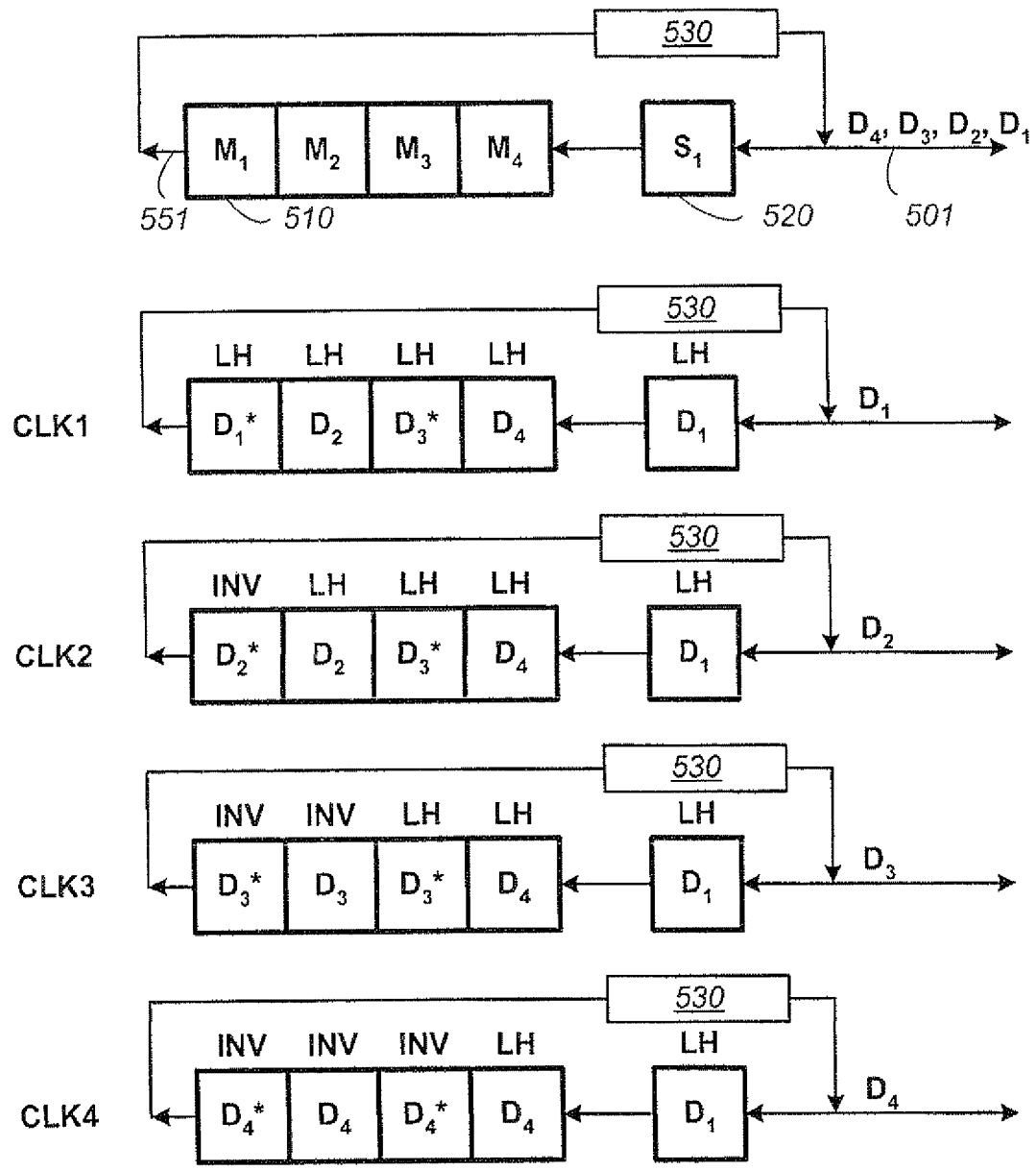
FIG. 15B illustrates a destructive mode reading out of the four data bits from the data latch stack of FIG. 15A.

FIG. 15B illustrates a destructive mode reading out of the four data bits from the data latch stack of FIG. 15A. As shown in FIG. 15A, the data latch stack is fully loaded after four clock cycles. In FIG. 15B, during $CLK_1$, the data $D^*_1$ in $M_1$ is read out after having its phase adjusted by the output line driver 530. During $CLK_2$, the master chain module $M_1$ behaves like an inverter (see FIG. 14C) and the data $D_2$ in $M_2$ is routed through $M_1$ and read out after having its phase adjusted by the output line driver 530. Similarly, during $CLK_3$ and $CLK_4$, the data $D_3$ and $D_4$ are read out accordingly. Thus, four bits of data are read out in four clock cycles. However, the original data stored in the latch stack is destroyed after this destructive mode read operation.

Figure 15C:
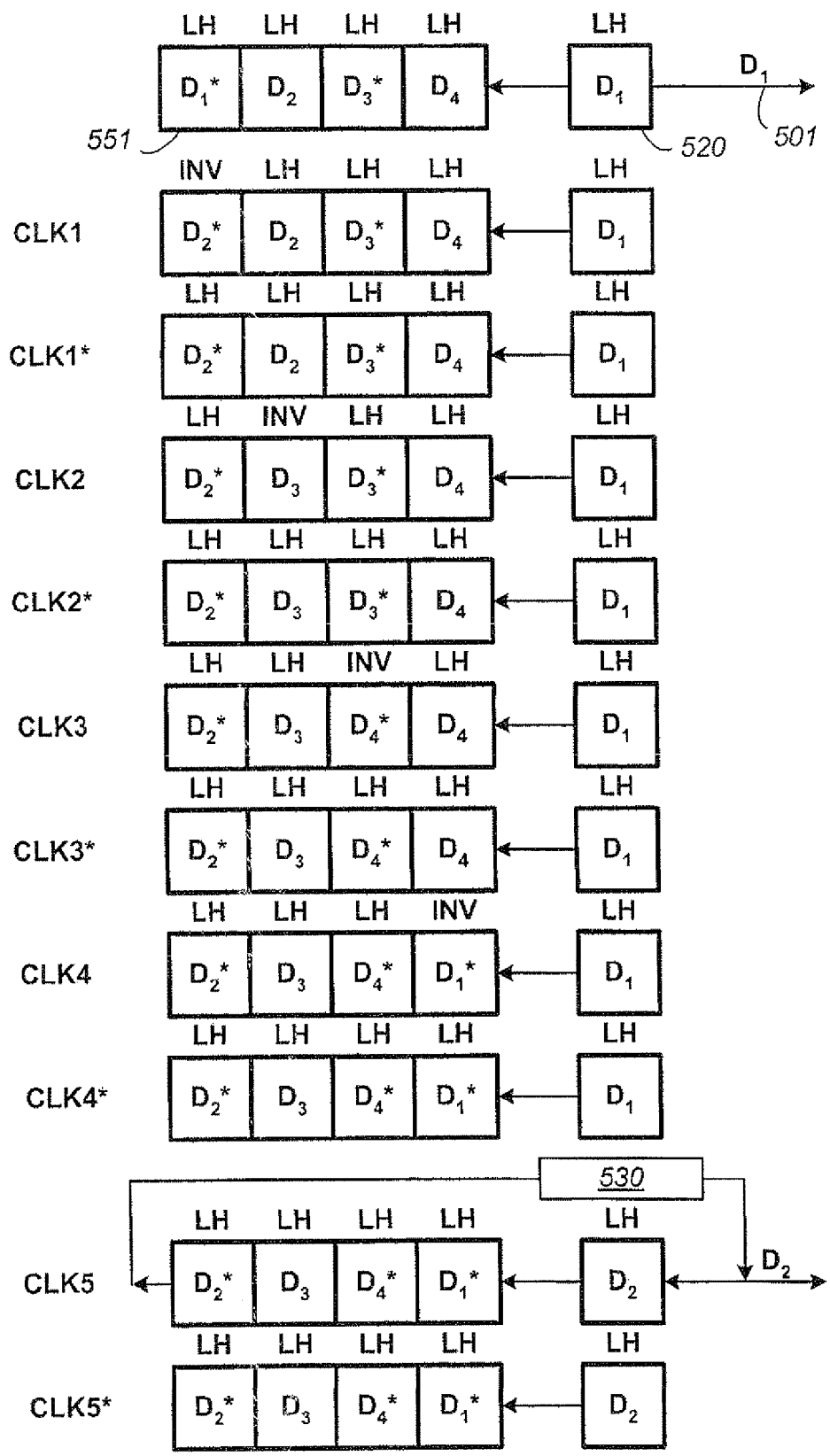
FIG. 15C illustrates another preferred embodiment with a preservative mode readout of the four data bits from the data latch stack of FIG. 14A.

FIG. 15C illustrates another preferred embodiment with a preservative mode readout of the four data bits from the data latch stack of FIG. 15A. As shown in FIG. 15A, the data latch stack is fully loaded after four clock cycles. It can be seen that if the bit to be read out is at the output end of the chain, i.e., $M_1$, it can be readily read out without affecting the data in the latch stack. When the latch stack is fully loaded, $D_1$ is in $M_1$ and is readily read out. In order to read the other bits of data, the chain is looped around itself and the slave link module $S_1$ is enlisted to shuffle the bits among the chain modules and to rotate the bits around the loop. Thus, to read out the data $D_2$, it must first be rotated to $M_1$ without destroying the other data.

In FIG. 15C, a copy of $D_1$ is already saved at $S_1$. During $CLK_1$, only the master link latch $M_1$ is turned into an inverter (see FIG. 14C) and the data $D_2$ in $M_2$ is transferred to and latched by $M_1$ at $CLK^*_1$. Thus, $D_1$ is rotated to $S_1$ and $D_2$ is rotated to $M_1$ as $D^*_2$. During $CLK_2$, only $M_2$ is turned into an inverter and the data $D_3$ in $M_3$ is transferred to and latched by $M_2$ at $CLK^*_2$. Thus, $D_3$ is now rotated to $M_2$. Similarly, during $CLK_3$ and $CLK_4$. The data $D_4$ is rotated to $M_3$ and a copy of $D_1$ from $S_1$ is rotated to $M_4$. Thus, after four clock cycles, the four bits of data among the master link modules are rotated by one link module along the chain. In particular, $D_2$ is now at $M_1$ and can be read out during $CLK_5$. At the same time a copy of $D_2$ is saved in $S_1$ to continue the next round of rotation. Thus, it takes four plus one clock cycles to rotate four bits of data by one place in the chain. In other words, for a preservative mode read, it will take k(k+1) clock cycles to read out k bits of data. For the example of k=4, it will take 20 clock cycles.

Figure 16A:
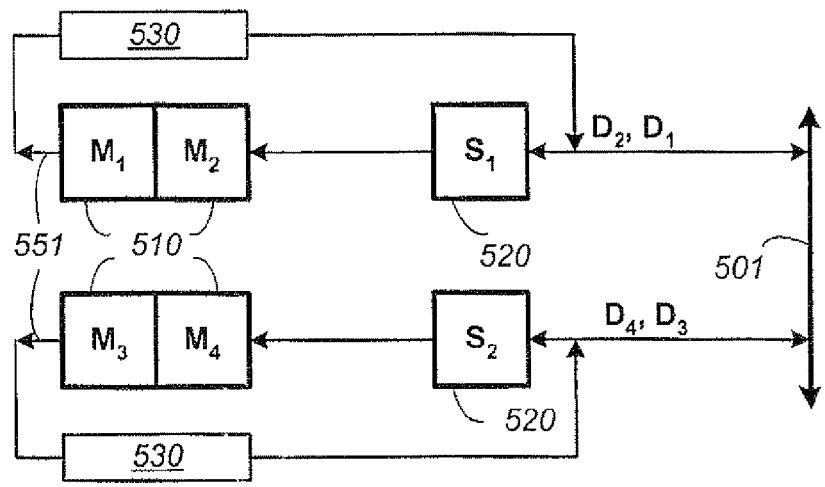
FIG. 16A illustrates another implementation of the "k+1" data latch stack shown in FIG. 14A.

FIG. 16A illustrates another implementation of the "k+1" data latch stack shown in FIG. 14A. The k master link modules 510 are broken up into several parallel branches, each sharing one slave link module 520. s. For the example of k=4, it may be grouped into two branches each having two master link modules, such as $M_1$, $M_2$ sharing $S_1$ as one branch and $M_3$, $M_4$ sharing $S_2$ as the second branch. The operations in the individual branches are similar to that of a single branch described in connection with FIG. 15C. Thus, in a preservative read mode, it will take 2(2-1)=6 clock cycles to rotate and read out the two bits $D_1$ and $D_2$ stored in the first branch. Similarly for the two bits $D_3$ and $D_4$ in the second branch. In this case, it will take a total of twelve clock cycles to read out all four bits as compared to the twenty clock cycles for the case of described in FIG. 15C.

Thus it can be seen that there is tradeoff between number latches required and the speed of reading out from the latches. The less number slave latches used, the longer is the cycle time.

Figure 16B:
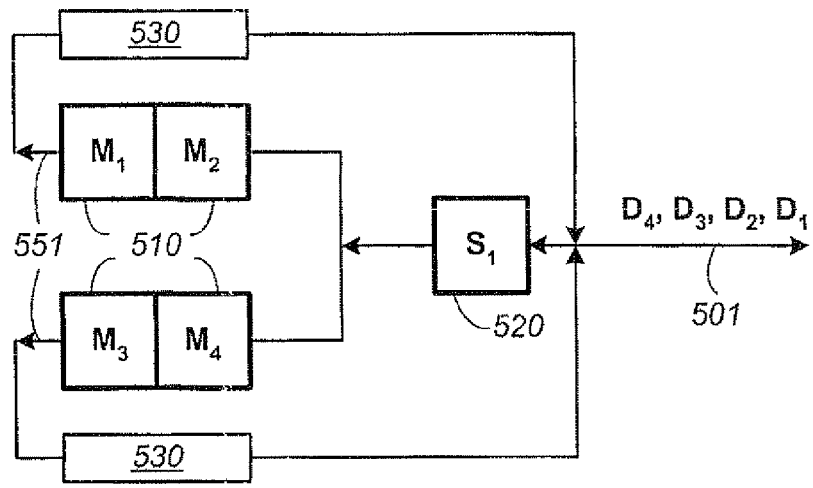
FIG. 16B illustrates another preferred implementation of the "k+1" data latch stack shown in FIG. 13A.

FIG. 16B illustrates another preferred implementation of the "k+1" data latch stack shown in FIG. 14A. The k master link modules 510 are grouped into parallel branches, similar to that shown in FIG. 16A except all branches share the same slave link module 520 such as $S_1$. For the example of k=4, it may be grouped into two branches, each having two master link modules, such as $M_1$, $M_2$ as one branch and $M_3$, $M_4$ as the second branch. The two branches share the same slave link module $S_1$. When the first branch is being read out, rotation is done through $M_1$, $M_2$ and $S_1$. When the second branch is being read out, rotation is done through $M_3$, $M_4$ and $S_1$. In this case, it will take six clock cycles to read out $D_1$ and $D_2$ and another six clock cycles to read out $D_3$ and $D_4$, requiring a total of 12 clock cycles for reading out four bits as in the case of FIG. 16A. However, only one slave link module 520 is employed.

Figure 17:
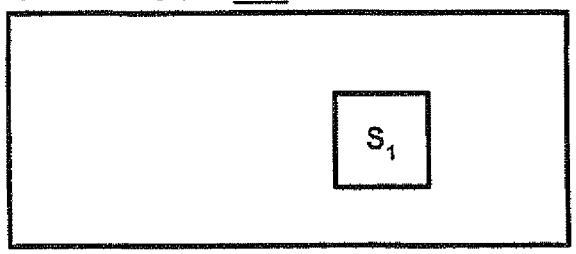
FIG. 17 illustrates another preferred implementation of the slave link module.

FIG. 17 illustrates another preferred implementation of the slave link module. Since the number of slave link modules 520 is quite small, typically being just one for each stack, it can be located in the processor 222 (see also FIG. 12.) In the preferred embodiment, the slave link module(s) share the latches or registers already used by the processor 222.

Although the various aspects of the present invention have been described with respect to certain embodiments, it is understood that the invention is entitled to protection within the full scope of the appended claims.

What is claimed is:

1. A method of reading or writing an array of non-volatile memory cells, comprising:
   providing a set of read/write circuits;
   coupling said set of read/write circuits to an entire row of memory cells in the array in parallel via a corresponding set of bit lines, the entire row of memory cells being contiguous and adjacent to each other along the row; and
   operating said set of read/write circuits to read or write on said entire row of memory cells in parallel, wherein said set of read/write circuits includes a corresponding set of read/write modules coupled to the corresponding set of bit lines, and wherein said array of non-volatile memory cells is organized into erasable blocks of EEPROM cells.

2. The method as in claim 1, wherein said array of the non-volatile memory cells is of the NAND type.

3. The method as in claim 1, wherein said plurality of non-volatile memory cells is constituted from NROM cells.

4. The method as in claim 1, wherein each memory cell stores one bit of data.

5. The method as in claim 1, wherein each memory cell stores more than one bit of data.

6. The method as in claim 1, wherein said corresponding set of read/write modules further comprises:
   a corresponding set of read/write module cores.

7. The method as in claim 6, wherein said corresponding set of read/write modules cores operates with a set of read/write module common portions.

8. The method as in claim 7, wherein multiple one read/write modules cores operate with a common read/write module core.

* * * * *